(12) United States Patent
You et al.

(10) Patent No.: US 10,868,007 B2
(45) Date of Patent: Dec. 15, 2020

(54) SEMICONDUCTOR DEVICE

(71) Applicant: Samsung Electronics Co., Ltd., Suwon-si (KR)

(72) Inventors: Jung-Gun You, Ansan-si (KR); Se-Wan Park, Seoul (KR); Baik-Min Sung, Seoul (KR); Myung-Yoon Um, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/820,853

(22) Filed: Mar. 17, 2020

(65) Prior Publication Data
US 2020/0219875 A1   Jul. 9, 2020

Related U.S. Application Data

(63) Continuation of application No. 16/189,296, filed on Nov. 13, 2018, now Pat. No. 10,629,597, which is a (Continued)

(30) Foreign Application Priority Data

Mar. 16, 2015  (KR) .................. 10-2015-0035702

(51) Int. Cl.
*H01L 27/088*     (2006.01)
*H01L 29/78*      (2006.01)
(Continued)

(52) U.S. Cl.
CPC ...... *H01L 27/0886* (2013.01); *H01L 29/0657* (2013.01); *H01L 29/42356* (2013.01);
(Continued)

(58) Field of Classification Search
None
See application file for complete search history.

(56) References Cited

U.S. PATENT DOCUMENTS 6,815,738 B2   11/2004  Rim
7,163,851 B2    1/2007  Abadeer et al.
(Continued)

FOREIGN PATENT DOCUMENTS

JP   2009-16525 A    1/2009
WO   2014209297 A1  12/2014

OTHER PUBLICATIONS

1st Office Action dated Jun. 2, 2020 for the corresponding Chinese Patent Application No. CN 201610151295.1.

*Primary Examiner* — Alexander G Ghyka
(74) *Attorney, Agent, or Firm* — Muir Patent Law, PLLC

(57) ABSTRACT

A semiconductor device is provided. The semiconductor device includes a field insulating film on a substrate, a first fin type pattern which is formed on the substrate and protrudes upward from an upper surface of the field insulating film, and a gate electrode which intersects with the first fin type pattern on the field insulating film and includes a first portion and a second portion, the first portion being located on one side of the first fin type pattern and including a first terminal end of the gate electrode, and the second portion being located on the other side of the first fin type pattern, wherein a height from the substrate to a lowest part of the first portion is different from a height from the substrate to a lowest part of the second portion.

20 Claims, 21 Drawing Sheets

Related U.S. Application Data continuation of application No. 14/974,805, filed on Dec. 18, 2015, now Pat. No. 10,157,917.

(51) Int. Cl.
*H01L 29/06* (2006.01)
*H01L 29/423* (2006.01)
*H01L 21/8234* (2006.01)
*H01L 27/02* (2006.01)
*H01L 27/11* (2006.01)

(52) U.S. Cl.
CPC ........ *H01L 29/785* (2013.01); *H01L 29/7854* (2013.01); *H01L 21/823431* (2013.01); *H01L 21/823456* (2013.01); *H01L 27/0207* (2013.01); *H01L 27/1104* (2013.01)

(56) References Cited

U.S. PATENT DOCUMENTS

| | | |
|---|---|---|
| 7,701,018 B2 | 4/2010 | Yamagami et al. |
| 7,749,842 B2 | 7/2010 | Zhu et al. |
| 7,859,044 B2 | 12/2010 | Wona et al. |
| 10,157,917 B2 | 12/2018 | You et al. |
| 2010/0123173 A1 | 5/2010 | Tanaka |
| 2014/0312388 A1 | 10/2014 | Colinge |
| 2014/0319609 A1 | 10/2014 | Merelle et al. |
| 2014/0327081 A1 | 11/2014 | Hsieh et al. |
| 2014/0328128 A1 | 11/2014 | Louie et al. |
| 2016/0071941 A1 | 3/2016 | Nakatsuka |

1200

1300

1400

SEMICONDUCTOR DEVICE

CROSS-REFERENCE TO RELATED APPLICATION

This application is a continuation of U.S. application Ser. No. 16/189,296, filed on Nov. 13, 2018, which is a continuation of U.S. patent application Ser. No. 14/974,805, filed Dec. 18, 2015, issued as U.S. Pat. No. 10,157,917 on Dec. 18, 2018 which claims priority from Korean Patent Application No. 10-2015-0035702 filed Mar. 16, 2015 in the Korean Intellectual Property Office, the contents of each of which are hereby incorporated herein by reference in their entirety.

BACKGROUND

1. Technical Field

The present inventive concept relates to a semiconductor device.

2. Description of the Related Art

As one of scaling techniques for increasing the density of a semiconductor device, a multi-gate transistor in which a fin-shaped silicon body is formed on a substrate and a gate is formed on a surface of the silicon body has been suggested.

Since such a multi-gate transistor uses a three-dimensional channel, it is easily scaled. Further, even if a gate length of the multi-gate transistor is not increased, it is possible to improve the current control capability. Furthermore, it is possible to effectively suppress a short channel effect (SCE) in which the potential of a channel region is influenced by a drain voltage.

SUMMARY

Aspects of the present inventive concept provide a semiconductor device having improved operating characteristics.

Aspects of the present inventive concept are not restricted to those set forth herein. Other aspects of the present inventive concept that have not been mentioned will be clearly understood by those skilled in the art from the following description.

According to an aspect of the present inventive concept, there is provided a semiconductor device comprising a field insulating film on a substrate, a first fin type pattern which is formed on the substrate and protrudes upward from an upper surface of the field insulating film, and a gate electrode which intersects with the first fin type pattern on the field insulating film and includes a first portion and a second portion, the first portion being located on one side of the first fin type pattern and including a first terminal end of the gate electrode, and the second portion being located on the other side of the first fin type pattern, wherein a height from the substrate to a lowest part of the first portion is different from a height from the substrate to a lowest part of the second portion.

In some embodiments of the present inventive concept, the height from the substrate to the lowest part of the first portion is higher than the height from the substrate to the lowest part of the second portion.

In some embodiments of the present inventive concept, a thickness from an upper surface of the gate electrode to the lowest part of the second portion is thicker than a thickness from the upper surface of the gate electrode to the lowest part of the first portion.

In some embodiments of the present inventive concept, the semiconductor device may further comprise a trench which defines the first fin type pattern, and a height from a bottom surface of the trench to the lowest part of the first portion is higher than a height from the bottom surface of the trench to the lowest part of the second portion.

In some embodiments of the present inventive concept, the semiconductor device may further comprise a gate insulating film formed along a profile of the first fin type pattern between the gate electrode and the substrate. The gate insulating film between the second portion and the substrate is in contact with the field insulating film, and the gate insulating film between the first portion and the substrate is not in contact with the field insulating film.

In some embodiments of the present inventive concept, the semiconductor device may further comprise an interlayer insulating film on the field insulating film, the gate insulating film is formed between the interlayer insulating film and the gate electrode, and the gate insulating film is in contact with the interlayer insulating film in the first terminal end.

In some embodiments of the present inventive concept, the semiconductor device may further comprise a second fin type pattern which intersects with the gate electrode, the gate electrode includes a third portion, a fourth portion, and a second terminal end corresponding to the first terminal end, the third portion is disposed between the first fin type pattern and the second fin type pattern, and the fourth portion includes the second terminal end of the gate electrode.

In some embodiments of the present inventive concept, a height from the substrate to a lowest part of the third portion is substantially the same as a height from the substrate to a lowest part of the fourth portion.

In some embodiments of the present inventive concept, the device may further comprise a gate insulating film formed along a profile of the second fin type pattern between the gate electrode and the substrate. The gate insulating film between the third portion and the substrate and between the fourth portion and the substrate is in contact with the field insulating film.

In some embodiments of the present inventive concept, a thickness of the fourth portion is different from a thickness of the first portion.

In some embodiments of the present inventive concept, the second portion is disposed between the first fin type pattern and the second fin type pattern.

In some embodiments of the present inventive concept, the semiconductor device may further comprise an interlayer insulating film on the field insulating film, and a spacer formed between the interlayer insulating film and the first terminal end of the gate electrode.

In some embodiments of the present inventive concept, the first fin type pattern extends in a first direction, and the gate electrode extends in a second direction different from the first direction, the spacer is formed along the periphery of the gate electrode, and a thickness of the spacer formed on a sidewall of the gate electrode extending in the second direction is thicker than a thickness of the spacer formed between the interlayer insulating film and the first terminal end of the gate electrode.

In some embodiments of the present inventive concept, the spacer extends to the upper surface of the field insulating film along the sidewall of the first fin type pattern.

In some embodiments of the present inventive concept, the first fin type pattern extends in a first direction, and the gate electrode extends in a second direction different from the first direction, and an overlap width of the first fin type pattern and the gate electrode is narrower than a width in the first direction of the gate electrode.

According to another aspect of the present inventive concept, there is provided a semiconductor device comprising a field insulating film on a substrate, first and second fin type patterns which are formed on the substrate so as to be closest to each other and protrude upward from an upper surface of the field insulating film, respectively, a first gate electrode which intersects with the first fin type pattern on the field insulating film and includes a first portion and a second portion, the first portion and the second portion being placed with the fin type pattern interposed therebetween, and the first portion including a first terminal end of the first gate electrode, and a second gate electrode which intersects with the second fin type pattern on the field insulating film and includes a third portion and a fourth portion, the third portion and the fourth portion being placed with the second fin type pattern interposed therebetween, and the third portion including a second terminal end of the second gate electrode facing the first terminal end of the first gate electrode, wherein a height from the substrate to a lowest part of the first portion is different from a height from the substrate to a lowest part of the second portion.

In some embodiments of the present inventive concept, the height from the substrate to the lowest part of the first portion is higher than the height from the substrate to the lowest part of the second portion.

In some embodiments of the present inventive concept, a height from the substrate to a lowest part of the third portion is substantially the same as a height from the substrate to a lowest part of the fourth portion.

In some embodiments of the present inventive concept, a height from the substrate to the lowest part of the first portion is higher than a height from the substrate to the lowest part of the third portion.

In some embodiments of the present inventive concept, the height from the substrate to the lowest part of the first portion is different from the height from the substrate to the lowest part of the third portion.

In some embodiments of the present inventive concept, the height from the substrate to the lowest part of the third portion is higher than the height from the substrate to the lowest part of the fourth portion.

In some embodiments of the present inventive concept, the height from the substrate to the lowest part of the first portion is higher than the height from the substrate to the lowest part of the second portion.

In some embodiments of the present inventive concept, the first fin type pattern and the second fin type pattern are formed in a SRAM region.

In some embodiments of the present inventive concept, the semiconductor device may further comprise a trench that defines the first fin type pattern and the second fin type pattern. The height from the bottom surface of the trench to the lowest part of the first portion is higher than the height from the bottom surface of the trench to the lowest part of the second portion.

In some embodiments of the present inventive concept, the fin type pattern is not disposed between the first fin type pattern and the second fin type pattern.

According to still another aspect of the present inventive concept, there is provided a semiconductor device comprising a fin type pattern which includes a lower part and an upper part on a substrate, the fin type pattern including a first sidewall and a second sidewall facing each other, a field insulating film which is in contact with the lower part of the fin type pattern on the substrate and is non in contact with the upper part of the fin type pattern, and a gate electrode which intersects with the fin type pattern, and includes a first portion and a second portion, the first portion being located on the first sidewall of the fin type pattern, and the second portion being located on the second sidewall of the fin type pattern, wherein the first portion covers the whole first sidewall of the upper part of the fin type pattern which overlaps the gate electrode, and the second portion covers a part of the second sidewall of the upper part of the fin type pattern which overlaps the gate electrode.

In some embodiments of the present inventive concept, the second portion includes a terminal end of the gate electrode.

In some embodiments of the present inventive concept, the semiconductor device may further comprise an interlayer insulating film on the field insulating film. A part of the interlayer insulating film is interposed between the second portion and the field insulating film, and the interlayer insulating film is not interposed between the first portion and the field insulating film.

In some embodiments of the present inventive concept, the semiconductor may further comprise a high-dielectric constant gate insulating film formed along the profile of the fin type pattern between the fin type pattern and the gate electrode. The high-dielectric constant gate insulating film extends along the whole first sidewall of the upper part of the fin type pattern, and extends along a part of the second sidewall of the upper part of the fin type pattern.

According to still another aspect of the present inventive concept, there is provided a semiconductor device comprising a fin type pattern on a substrate, an insulating film which is formed on the substrate and includes a trench intersecting with the fin type pattern, a depth of a first portion of the trench on one side of the fin type pattern being different from a depth of a second portion of the trench on the other side of the fin type pattern, and a gate electrode which intersects with the fin type pattern and fills the trench.

In some embodiments of the present inventive concept, the semiconductor device may further comprise a gate insulating film formed along a sidewall and a bottom surface of the trench, the gate electrode is formed on the gate insulating film.

In some embodiments of the present inventive concept, the insulating film includes a field insulating film and an interlayer insulating film that are sequentially formed on a substrate, and the trench is formed in the interlayer insulating film.

In some embodiments of the present inventive concept, a depth of the first portion of the trench is shallower than a depth of the second portion of the trench, and a bottom surface of the second portion of the trench is defined by an upper surface of the field insulating film.

In some embodiments of the present inventive concept, the gate electrode formed by filling the first portion of the trench includes a terminal end of the gate electrode.

BRIEF DESCRIPTION OF THE DRAWINGS

The above and other aspects and features of the present inventive concept will become more apparent by describing in detail exemplary embodiments thereof with reference to the attached drawings, in which.

DETAILED DESCRIPTION OF THE EMBODIMENTS

Figure 1:
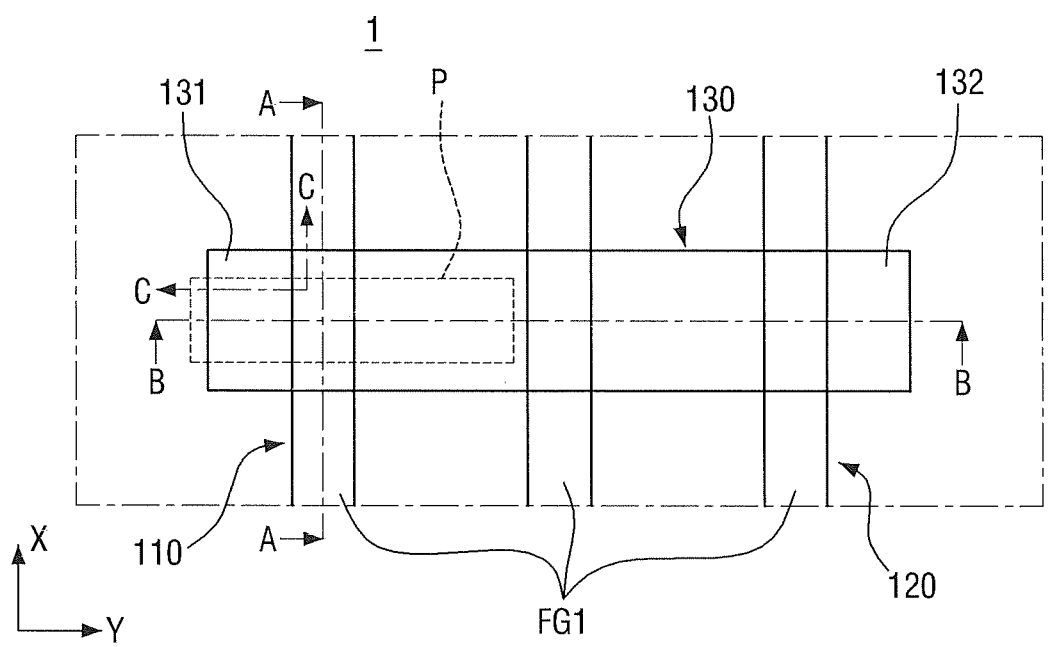
FIG. 1 is a layout diagram for explaining a semiconductor device according to a first embodiment of the present inventive concept.

Advantages and features of the present inventive concept and methods of accomplishing the same may be understood more readily by reference to the following detailed description of preferred embodiments and the accompanying drawings. The present inventive concept may, however, be embodied in many different forms and should not be construed as being limited to the embodiments set forth herein. Rather, these embodiments are provided so that this disclosure will be thorough and complete and will fully convey the concept of the invention to those skilled in the art, and the present inventive concept will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A semiconductor device according to a first embodiment of the present inventive concept will be described below with reference to FIGS. 1 to 5.

Figure 2:
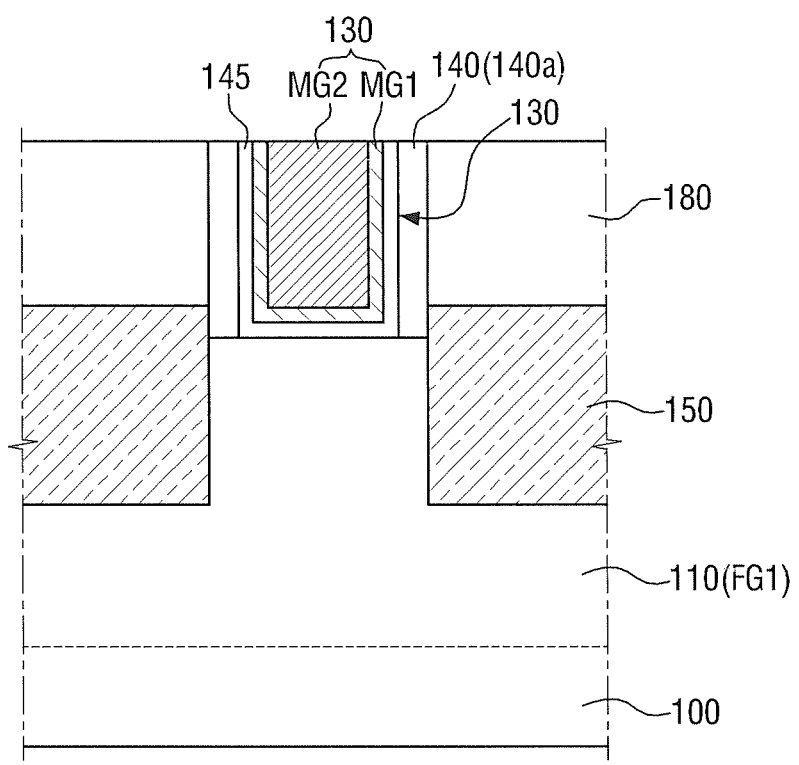
FIG. 2 is a cross-sectional view taken along a line A-A of FIG. 1.
Figure 3:
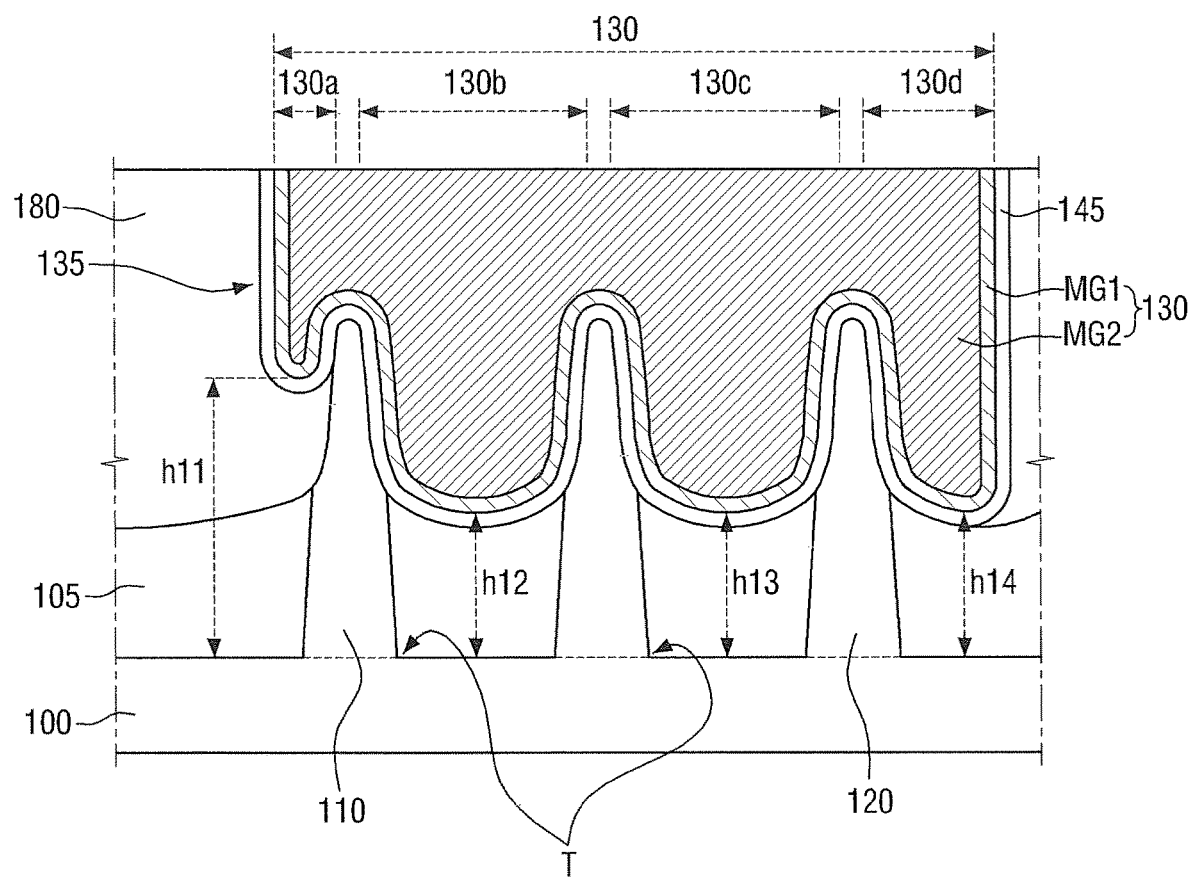
FIG. 3 is a cross-sectional view taken along a line B-B of FIG. 1.
Figure 4:
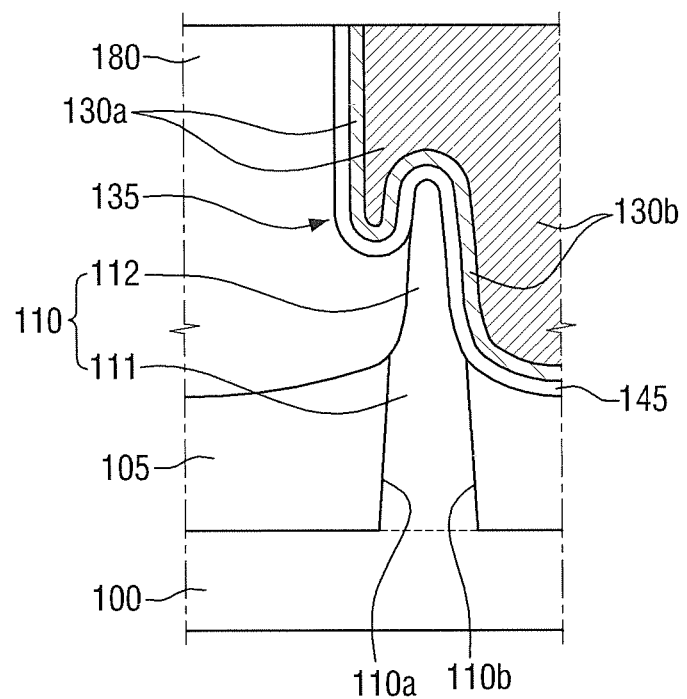
FIG. 4 is a cross-sectional view illustrating a region P of FIG. 1 taken along the line B-B.
Figure 5:
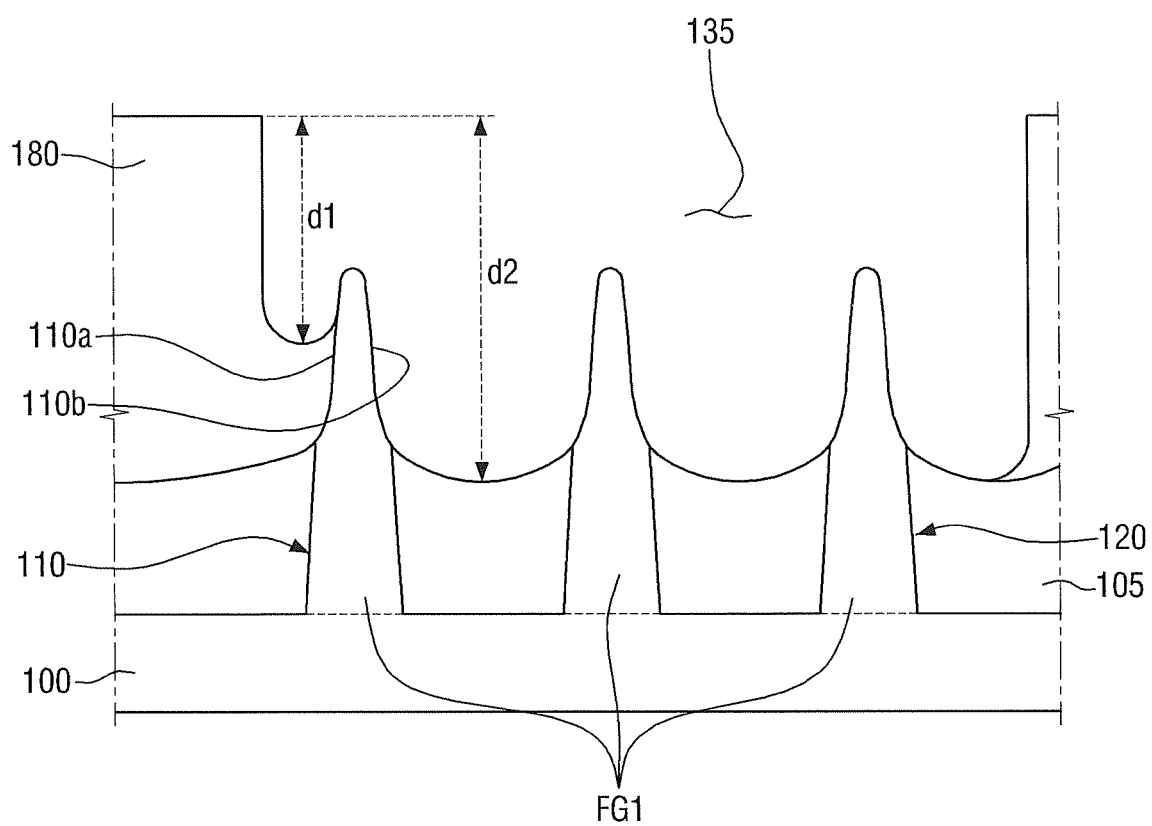
FIG. 5 is a diagram illustrating a configuration except a first gate electrode or the like in FIG. 3.

FIG. 1 is a layout diagram for explaining a semiconductor device according to a first embodiment of the present inventive concept. FIG. 2 is a cross-sectional view taken along a line A-A of FIG. 1. FIG. 3 is a cross-sectional view taken along a line B-B of FIG. 1. FIG. 4 is a cross-sectional view illustrating a region P of FIG. 1 taken along the line B-B. FIG. 5 is a diagram illustrating a configuration except a first gate electrode or the like in FIG. 3.

Referring to FIGS. 1 to 5, a semiconductor device 1 according to a first embodiment of the present inventive concept may include a first fin type pattern group FG1, a first gate electrode 130 or the like.

A substrate 100, for example, may be a bulk silicon or SOI (silicon-on-insulator). Alternatively, the substrate 100 may also be a silicon substrate or may contain other materials, for example, silicon germanium, indium antimonide, lead telluride, indium-arsenide, indium phosphide, gallium arsenide or gallium antimonide. Otherwise, the substrate 100 may be one in which an epitaxial layer is formed on a base substrate.

The first fin type pattern group FG1 may be formed on the substrate 100. The first fin type pattern group FG1 may protrude from the substrate 100. Here, the "fin type pattern group" may mean the fin type patterns, which intersect with one gate electrode. For example, the first fin type pattern group FG1 may be a group of fin type patterns, which intersect with the first gate electrode 130.

The first fin type pattern group FG1 may be defined by an isolation trench T. The isolation trench T may be disposed on either side of each fin type pattern that is included in the first fin type pattern group FG1.

In FIG. 3, a bottom surface of the isolation trench T is illustrated as being defined by the substrate 100, but is not limited thereto. When a trench deeper than the isolation trench T is formed around the first fin type pattern group FG1 and an active region is defined, the bottom surface of the isolation trench T may not be defined by the substrate 100. Otherwise, even when the fin type patterns included in the first fin type pattern group FG1 are separated by the trench deeper than the isolation trench T, the bottom surface of the isolation trench T may not be defined by the substrate 100.

Hereinafter, the bottom surface of the isolation trench T will be described as defined by the substrate 100.

The first fin type pattern group FG1 may include fin type patterns, which extend along a first direction X. The respective fin type patterns included in the first fin type pattern group FG1 may be extended along the first direction X. The fin type patterns included in the first fin type pattern group FG1 may be disposed in a second direction Y.

The first fin type pattern group FG1 may include a first fin type pattern 110 and a second fin type pattern 120. Each of the first fin type pattern 110 and the second fin type pattern 120 may mean the fin type patterns disposed on the outermost side of the first fin type pattern group FG1. For example, the first fin type pattern group FG1 is not located on one side of the first fin type pattern 110 in the second direction Y, and the fin type pattern included in the first fin type pattern group FG1 may be located on the other side of the first fin type pattern 110.

Although FIG. 1 illustrates that the first fin type pattern group FG1 includes three fin type patterns, it is intended merely for convenience of description and is not limited thereto. In other words, two or more fin type patterns may be disposed between the first fin type pattern 110 and the second fin type pattern 120.

Otherwise, other fin type patterns may not be disposed between the first fin type pattern 110 and the second fin type pattern 120. That is, the first fin type pattern 110 and the second fin type pattern 120 may be closest to each other.

The first fin type pattern group FG1 may be a part of the substrate 100 and may include an epitaxial layer grown from the substrate 100. The respective fin type patterns included in the first fin type pattern group FG1 may contain the same material each other.

The first fin type pattern group FG1, for example, may contain silicon or germanium, which is an elemental semiconductor material. The first fin type pattern group FG1 may contain a compound semiconductor, and for example, may contain a group IV-IV compound semiconductor or a group III-V compound semiconductor.

Specifically, when taking the group IV-IV compound semiconductor as an example, the first fin type pattern group FG1 may be a binary compound or a ternary compound containing at least two or more of carbon (C), silicon (Si), germanium (Ge) and tin (Sn), or a compound in which these elements are doped with a group IV element.

When taking the group III-V compound semiconductor as an example, the first fin type pattern group FG1 may be one of a binary compound, a ternary compound or a quaternary compound which is formed by binding at least one of aluminum (Al), gallium (Ga) and indium (In) as a group III element to one of phosphorus (P), arsenic (As) and antiammonium (Sb) as a group V element.

In the following description, the first fin type pattern group FG1, for example, will be described as being a silicon fin type pattern group including silicon.

A field insulating film 105 may be formed on the substrate 100. The field insulating film 105 may be formed so as to fill a part of the isolation trench T. The field insulating film 105, for example, may contain one of an oxide film, a nitride film, an oxynitride film or a combination thereof.

The field insulating film 105 may be in contact with a part of the respective fin type patterns included in the first fin type pattern group FG1. For example, the first fin type pattern 110 may include an upper part 112 and a lower part 111. The field insulating film 105 is in contact with the lower part 111 of the first fin type pattern, but it may not be in contact with the upper part 112 of the first fin type pattern.

Alternatively, the first fin type pattern 110 may include a first sidewall 110a and a second sidewall 110b that face each other in the second direction Y. The field insulating film 105 may cover a part of the first sidewall 110a of the first fin type pattern and a part of the second sidewall 110b of the first fin type pattern.

Thus, at least a part of the respective fin type patterns included in the first fin type pattern group FG1 may protrude upward from the upper surface of the field insulating film 105. For example, at least a part of the first fin type pattern 110 and the second fin type pattern 120 may protrude upward from the upper surface of the field insulating film 105, respectively.

The first gate electrode 130 may be formed so as to extend in the second direction Y and intersect with the first fin type pattern group FG1. The first gate electrode 130 may be formed on the field insulating film 105. The first gate electrode 130 may intersect with the first fin type pattern 110 and the second fin type pattern 120.

In FIG. 1, the first gate electrode 130 is illustrated as being in a rectangular form, but is not limited thereto. Further, when the first gate electrode 130 is in the rectangular form, it may include a long side and a short side. Even when a corner at which the long and short sides of the first gate electrode 130 meet is formed in a round shape, it is obvious that those skilled in the art to which the present inventive concept pertains may distinguish between the long and short sides.

The first gate electrode 130 may include a first terminal end 131 and a second terminal end 132 that correspond to each other. Each of the first terminal end 131 of the first gate electrode and the second terminal end 132 of the first gate electrode may include the short side of the first gate electrode 130. The first terminal end 131 of the first gate electrode may be adjacent to the first fin type pattern 110, and the second terminal end 132 of the first gate electrode may be adjacent to the second fin type pattern 120.

More specifically, the first terminal end 131 of the first gate electrode may be closest to the first fin type pattern 110 of the first fin type pattern group FG1, and the second terminal end 132 of the first gate electrode may be closest to the second fin type pattern 120 of the first fin type pattern group FG1.

The first gate electrode 130 may include a first portion 130a, a second portion 130b, a third portion 130c and a fourth portion 130d that are sequentially located in the second direction Y.

The first portion 130a of the first gate electrode may include the first terminal end 131 of the first gate electrode.

The fourth portion 130d of the first gate electrode may include the second terminal end 132 of the first gate electrode.

The second portion 130b of the first gate electrode and the third portion 130c of the first gate electrode may be disposed between the first fin type pattern 110 and the second fin type pattern 120. If there is no other fin type pattern between the first fin type pattern 110 and the second fin type pattern 120, the second portion 130b of the first gate electrode and the third portion 130c of the first gate electrode may be the same portion.

The first portion 130a of the first gate electrode and the second portion 130b of the first gate electrode may be located with the first fin type pattern 110 interposed therebetween. Each of the first portion 130a of the first gate electrode and the second portion 130b of the first gate electrode may be located on one side and the other side of the first fin type pattern 110.

For example, the first portion 130a of the first gate electrode may be formed on the first sidewall 110a of the first fin type pattern, and the second portion 130 of the first gate electrode may be formed on the second sidewall 110b of the first fin type pattern.

The second portion 130b of the first gate electrode may be a portion, which is closest to the first portion 130a of the first gate electrode. In other words, the first fin type pattern group FG1 except the first fin type pattern 110 may not be disposed between the first portion 130a of the first gate electrode and the second portion 130b of the first gate electrode.

A part of the first gate electrode 130 covering the upper surface of the first fin type pattern 110 may be located between the first portion 130a of the first gate electrode and the second portion 130b of the first gate electrode.

The third portion 130c of the first gate electrode and the fourth portion 130d of the first gate electrode may be located with the second fin type pattern 120 interposed therebetween. Each of the third portion 130c of the first gate electrode and the fourth portion 130d of the first gate electrode may be located on one side and the other side of the second fin type pattern 120.

The third portion 130c of the first gate electrode may be a portion that is closest to the fourth portion 130d of the first gate electrode. In other words, the first fin type pattern group FG1 except the second fin type pattern 120 may not be disposed between the third portion 130c of the first gate electrode and the fourth portion 130d of the first gate electrode. A part of the first gate electrode 130 covering the upper surface of the second fin type pattern 120 may be located between the third portion 130c of the first gate electrode and the fourth portion 130d of the first gate electrode.

The first gate electrode 130 may include metal layers MG1, MG2. As illustrated, the first gate electrode 130 may be formed by lamination of two or more metal layers MG1, MG2. The first metal layer MG1 may serve to adjust the work function, and the second metal layer MG1 may serve to fill a space formed by the first metal layer MG1. For example, the first metal layer MG1, for example, may contain at least one of TiN, WN, TiAl, TiAlN, TaN, TiC, TaC TaCN and TaSiN or a combination thereof, but is not limited thereto. Further, the second metal layer MG2, for example, may contain at least one of W, Al, Cu, Co, Ti, Ta, poly-Si, SiGe or a metal alloy, but is not limited thereto.

The first gate electrode 130, for example, may be formed through a replacement process or a gate-last process, but is not limited thereto.

A first gate insulating film 145 may be formed between the first fin type pattern group FG1 and the first gate electrode 130. The first gate insulating film 145 may be formed between the first fin type pattern 110 and the first gate electrode 130 and may be formed between the second fin type pattern 120 and the first gate electrode 130.

The first gate insulating film 145 may be formed along a profile of the first fin type pattern group FG1 protruding upward from the field insulating film 105, for example, a profile of the first fin type pattern 110 and a profile of the second fin type pattern 120. Further, the first gate insulating film 145 may also be formed between the first gate electrode 130 and the field insulating film 105.

The first gate insulating film 145 may contain silicon oxide, silicon oxynitride, silicon nitride and a high dielectric material having a dielectric constant higher than the silicon oxide. The high dielectric material may contain, but not limited to, for example, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide or lead zinc niobate.

A spacer 140 may be formed on the sidewall of the first gate electrode 130. The spacer 140 may include a first portion 140a formed on the sidewall including the long side of the first gate electrode 130. In the semiconductor device according to a first embodiment of the invention, the second portion of the spacer 140 may not be formed on the sidewall including the short side of the first gate electrode 130.

The spacer 140 may contain, but not limited to, for example, at least one of silicon nitride (SiN), silicon oxynitride (SiON), silicon oxide (SiO2), silicon oxycarbonitride (SiOCN) and combinations thereof.

A first source/drain 150 may be formed on both sides in the first direction X around the first gate electrode 130. For example, the first source/drain 150 may be formed on the first fin type pattern 110. The source/drain may also be formed on the second fin type pattern 120 and other fin type patterns included in the first fin type pattern group FG1, respectively.

For example, when the first fin type pattern 110 is used as a channel region of the PMOS transistor, the first source/drain 150 may contain a compressive stress material. For example, the compressive stress material may be a material having a lattice constant greater than Si, and for example, may be SiGe. The compressive stress material can improve the mobility of the carrier of the channel region by applying the compressive stress to the first fin type pattern 110.

Alternatively, when the first fin type pattern 110 is used as a channel region of the NMOS transistor, the first source/drain 150 may be the same material as the first fin type pattern 110 or a tensile stress material. For example, when the first fin type pattern 110 is Si, the first source/drain 150 may Si or may contain a material (e.g., silicon carbide) having a lattice constant smaller than Si.

An interlayer insulating film 180 may cover the first fin type pattern group FG1, the first source/drain 150 or the like. The interlayer insulating film 180 may cover the sidewall of the first gate electrode 130. The interlayer insulating film 180 may be formed on the substrate 100, and more specifically, on the field insulating film 105.

In FIGS. 2 to 5, although the interlayer insulating film 180 is illustrated as a single layer, it is intended merely for the convenience of explanation and is not limited thereto. That is, it is a matter of course that the interlayer insulating film 180 may be made up of a plurality of layers which includes an etching stop film, a planarization insulating film having etching resistance different from the etching stop film or the like.

The interlayer insulating film 180, for example, may contain at least one of silicon oxide, silicon nitride, silicon oxynitride and a low dielectric constant material having the dielectric constant lower than silicon oxide. The low dielectric constant material may contain, but not limited to, for example, FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material or combinations thereof.

The interlayer insulating film 180 may include a first trench 135. The first gate electrode 130 may be formed in the first trench 135 by filling the first trench 135. That is, the first trench 135 may be formed so as to extend long in the second direction Y and intersect with the first fin type pattern group FG1.

Both the field insulating film 105 and the interlayer insulating film 180 formed on the substrate 100 may be an insulating film. Therefore, the first trench 135 may be formed in the insulating films 105, 180 formed on the substrate 100, and more specifically, it may be formed in the interlayer insulating film 180.

The bottom surface of the first trench 135 may be defined along the profile of the first fin type pattern group FG1 protruding upward from the upper surface of the field insulating film 105, and the upper surface of the field insulating film 105. The bottom surface of the first trench 135 may be uneven shape.

The sidewall of the first trench 135 facing the long side of the first gate electrode 130 may be defined by the spacer 140. However, in the semiconductor device 1 according to the first embodiment of the present inventive concept, since the spacer 140 is not formed on the sidewall including the short side of the first gate electrode 130, the sidewall of the first trench 135 facing the short side of the first gate electrode 130 may be defined by the interlayer insulating film 180.

In addition, the first gate insulating film 145 may be formed along the sidewall and the bottom surface of the first trench 135. The first gate insulating film 145 may be formed between the first gate electrode 130 and the interlayer insulating film 180, and between the first gate electrode 130 and the field insulating film 105.

In the semiconductor device 1 according to the first embodiment of the present inventive concept, since the spacer 140 is not formed on the sidewall including the short side of the first gate electrode 130, the first gate insulating film 145 formed along the sidewall including the short side of the first gate electrode 130 may be in contact with the interlayer insulating film 180. In other words, the first gate insulating film 145 and the interlayer insulating film 180 may be in contact with each other in the portion of first terminal end 131 of the first gate electrode.

A height from the substrate 100 to a lowest part of the first portion 130a of the first gate electrode may be a first height h11, a height from the substrate 100 to a lowest part of the second portion 130b of the first gate electrode may be a second height h12, a height from the substrate 100 to a lowest part of the third portion 130c of the first gate electrode may be a third height h13, and a height from the substrate 100 to a lowest part of the fourth portion 130d of the first gate electrode may be a fourth height h14.

In the semiconductor device according to the embodiments of the present inventive concept, the height h11 from the substrate 100 to the lowest part of the first portion 130a of the first gate electrode may be different from the height h12 from the substrate 100 to the lowest part of the second portion 130b of the first gate electrode.

More specifically, the height h11 from the substrate 100 to the lowest part of the first portion 130a of the first gate electrode may be higher than the height h12 from the substrate 100 to the lowest part of the second portion 130b of the first gate electrode.

In addition, the height h11 from the bottom surface of the isolation trench T to the lowest part of the first portion 130a of the first gate electrode may be higher than the height h12 from the bottom surface of the isolation trench T to the lowest part of the second portion 130b of the first gate electrode.

In other words, the first portion 130a of the first gate electrode may cover a part of the first sidewall 110a of the upper part 112 of the first fin type pattern that overlaps the first gate electrode 130. Meanwhile, the second portion 130b of the first gate electrode may cover the whole second sidewall 110b of the upper part 112 of the first fin type pattern that overlaps the first gate electrode 130.

Also, in other words, a thickness of the first portion 130a of the first gate electrode located on one side of the first fin type pattern 110 may be thinner than a thickness of the second portion 130b of the first gate electrode located on the other side of the first fin type pattern 110. That is, the thickness from the upper surface of the first gate electrode 130 to the lowest part of the second portion 130b of the first gate electrode may be thicker than the thickness from the upper surface of the first gate electrode 130 to the lowest part of the first portion 130a of the first gate electrode.

The first trench 135 includes a first portion of the first trench 135 located on one side of the first fin type pattern 110, and a second portion of the first trench 135 located on the other side of the first fin type pattern 110. The first gate electrode 130 may be formed by filling the first trench 135 formed in the interlayer insulating film 180.

The first portion 130a of the first gate electrode may be formed by filling the first portion of the first trench 135, and the second portion 130b of the first gate electrode may be formed by filling the second portion of the first trench 135.

Thus, in the semiconductor device according to the embodiments of the present inventive concept, a depth d1 of the first portion of the first trench 135 located on one side of the first fin type pattern 110 may be different from a depth d2 of the second portion of the first trench 135 located on the other side of the fin type pattern 110.

More specifically, the depth d1 of the first portion of the first trench 135 located on one side of the first fin type pattern 110 may be shallower than the depth d2 of the second portion of the first trench 135 located on the other side of the first fin type pattern 110.

A bottom surface of the first portion of the first trench 135 located on one side of the first fin pattern 110 is defined by the interlayer insulating film 180, but a bottom surface of the second portion of the first trench 135 located on the other side of the first fin type pattern 110 may be defined by the field insulating film 105.

Thus, a part of the interlayer insulating film 180 may be interposed between the lowest part of the first portion 130a of the first gate electrode and the field insulating film 105. However, the interlayer insulating film 180 may not be interposed between the lowest part of the second portion 130b of the first gate electrode and the field insulating film 105.

In addition, a part of the first sidewall 110a of the upper part 112 of the first fin type pattern is exposed by the first trench 135, and the whole second sidewall 110b of the upper part 112 of the first fin type pattern may be exposed by the first trench 135.

A first gate insulating film 145 formed between the first gate electrode 130 and the field insulating film 105 may be formed along the sidewall and the bottom surface of the first trench 135. Thus, the first gate insulating film 145 containing a dielectric material having the high-dielectric constant extends along the whole second sidewall 110b of the upper part 112 of the first fin type pattern, but the first gate insulating film 145 may extend along a part of the first sidewall 110a of the upper part 112 of the first fin type pattern.

More specifically, the first gate insulating film 145 may be formed along a part of the first sidewall 110a of the upper part 112 of the first fin type pattern that overlaps the first gate electrode 130. However, the first gate insulating film 145 may be formed along the whole second sidewall 110b of the upper part 112 of the first fin type pattern that overlaps the first gate electrode 130.

Thus, the first gate insulating film 145 formed between the substrate 100 and the first portion 130a of the first gate electrode is not in contact with the field insulating film 105. Meanwhile, the first gate insulating film 145 formed between the substrate 100 and the second portion 130b of the first gate electrode may be in contact with the field insulating film 105.

In the semiconductor device according to the first embodiment of the present inventive concept, a height h13 from the substrate 100 to the lowest part of the third portion 130c of the first gate electrode may be substantially the same as a height h14 from the substrate 100 to the lowest part of the fourth portion 130d of the first gate electrode.

Here, the expression "the heights are substantially the same" means that the heights are completely the same at the two compared positions, and tiny differences in height capable of occurring due to the degree of recess of the upper surface of the field insulating film 105 are included.

In addition, the height h13 from the bottom surface of the isolation trench T to the lowest part of the third portion 130c of the first gate electrode may be substantially the same as the height h14 from the bottom surface of the isolation trench T to the lowest part of the fourth portion 130d of the first gate electrode.

In other words, each of the third portion 130c of the first gate electrode and the fourth portion 130d of the first gate electrode may cover the whole sidewall of the second fin type pattern 120 protruding upward from the upper surface of the field insulating film 105.

The thickness of the third portion 130c of the first gate electrode located on one side of the second fin type pattern 120 may be substantially the same as the thickness of the fourth portion 130d of the first gate electrode located on the other side of the second fin type pattern 120. That is, the thickness from the upper surface of the first gate electrode 130 to the lowest part of the third portion 130c of the first gate electrode may be substantially the same as the thickness from the upper surface of the first gate electrode 130 to the lowest part of the fourth portion 130d of the first gate electrode.

Here, the expression "thicknesses are substantially the same" means that that the heights are completely the same at the two compared positions, and tiny differences in thickness capable of occurring due to the degree of recess of the upper surface of the field insulating film 105 are included.

Moreover, the interlayer insulating film 180 may not be interposed between the lowest part of the third portion 130c of the first gate electrode and the field insulating film 105, and between the lowest part of the fourth portion 130d of the first gate electrode and the field insulating film 105.

Thus, the first gate insulating film 145 formed between the substrate 100 and the third portion 130c of the first gate electrode, and between the substrate 100 and the fourth portion 130d of the first gate electrode may be in contact with the field insulating film 105.

As illustrated in FIG. 3, the height h11 from the substrate 100 to the lowest part of the first portion 130a of the first gate electrode may be different from the height h14 from the substrate 100 to the lowest part of the fourth portion 130d of the first gate electrode.

More specifically, the height h11 from the substrate 100 to the lowest part of the first portion 130a of the first gate electrode may be higher than the height h14 from the substrate 100 to the lowest part of the fourth portion 130d of the first gate electrode.

In other words, the thickness of the first portion 130a of the first gate electrode may be different from the thickness of the fourth portion 130d of the first gate electrode. More specifically, the thickness from the upper surface of the first gate electrode 130 to the lowest part of the fourth portion 130d of the first gate electrode may be thicker than the thickness from the upper surface of the first gate electrode 130 to the lowest part of the first portion 130a of the first gate electrode.

Figure 6:
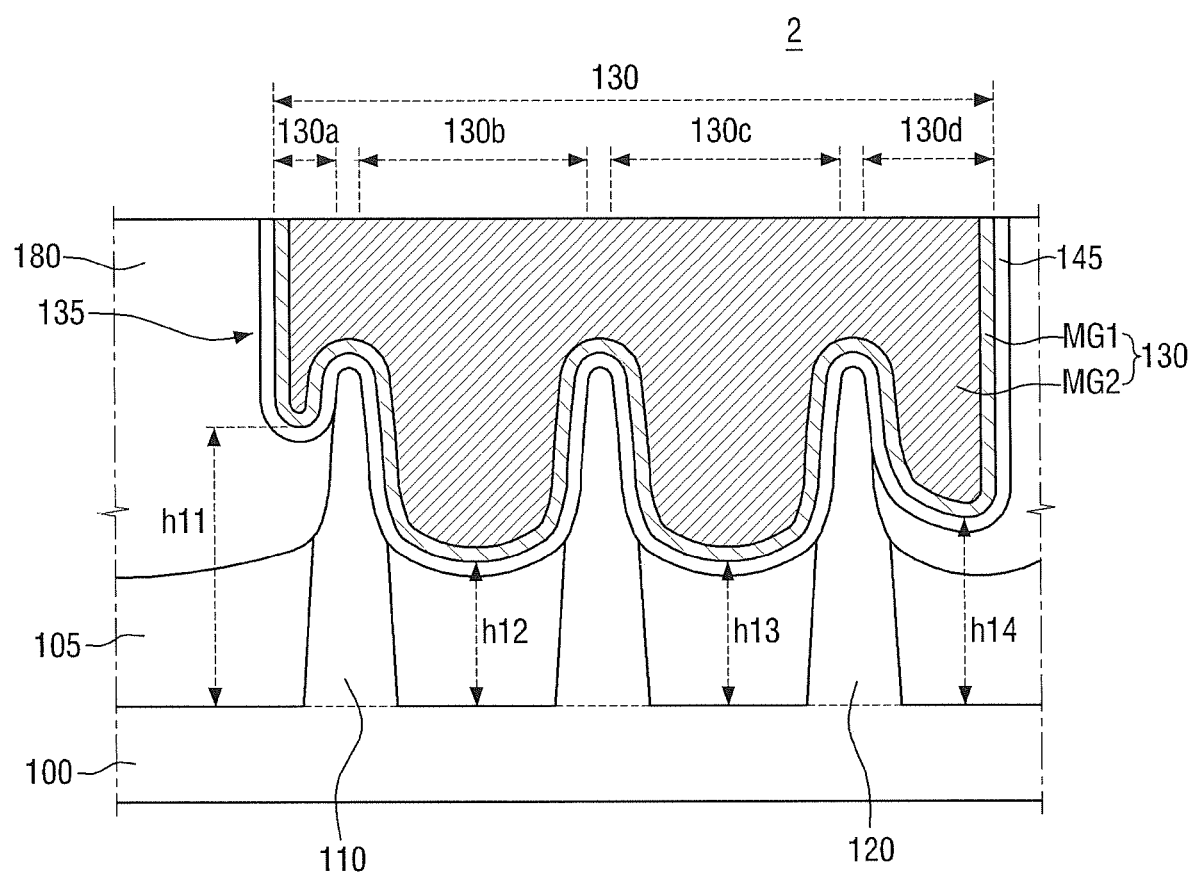
FIG. 6 is a diagram for explaining a semiconductor device according to a second embodiment of the present inventive concept.

FIG. 6 is a diagram for explaining a semiconductor device according to a second embodiment of the present inventive concept. For convenience of explanation, differences from the configurations described with reference to FIGS. 1 to 5 will be mainly described.

Referring to FIG. 6, in a semiconductor device 2 according to the second embodiment of the present inventive concept, a height h13 from the substrate 100 to the lowest part of the third portion 130c of the first gate electrode may be different from a height h14 from the substrate 100 to the lowest part of the fourth portion 130d of the first gate electrode.

More specifically, the height h14 from the substrate 100 to the lowest part of the fourth portion 130d of the first gate electrode may be higher than the height h13 from the substrate 100 to the lowest part of the third portion 130c of the first gate electrode.

In addition, the height h14 from the bottom surface of the isolation trench T to the lowest part of the fourth portion 130d of the first gate electrode may be higher than the height h13 from the bottom surface of the isolation trench T to the lowest part of the third portion 130c of the first gate electrode.

In other words, the thickness of the fourth portion 130d of the first gate electrode located on the other side of the second fin type pattern 120 may be thinner than the thickness of the third portion 130c of the first gate electrode located on one side of the second fin type pattern 120.

That is, the thickness from the upper surface of the first gate electrode 130 to the lowest part of the third portion 130c of the first gate electrode may be thicker than the thickness from the upper surface of the first gate electrode 130 to the lowest part of the fourth portion 130d of the first gate electrode.

The bottom surface of a part of the first trench 135 in which the third portion 130c of the first gate electrode is formed is defined by the field insulating film 105, but the bottom surface of the other part of the first trench 135 in which the fourth portion 130d of the first gate electrode 130d is formed may be defined by the interlayer insulating film 180.

Accordingly, a part of the interlayer insulating film 180 may be interposed between the lowest part of the fourth portion 130d of the first gate electrode and the field insulating film 105. However, the interlayer insulating film 180 may not be interposed between the lowest part of the third portion 130c of the first gate electrode and the field insulating film 105.

In addition, the first gate insulating film 145 formed between the substrate 100 and the fourth portion 130d of the first gate electrode may be not in contact with the field insulating film 105. Meanwhile, the first gate insulating film 145 formed between the substrate 100 and the third portion 130c of the first gate electrode may be in contact with the field insulating film 105.

FIG. 6 illustrates that the height h11 from the substrate 100 to the lowest part of the first portion 130a of the first gate electrode is different from the height h14 from the substrate 100 to the lowest part of the fourth portion 130d of the first gate electrode, but is not limited thereto.

Figure 7:
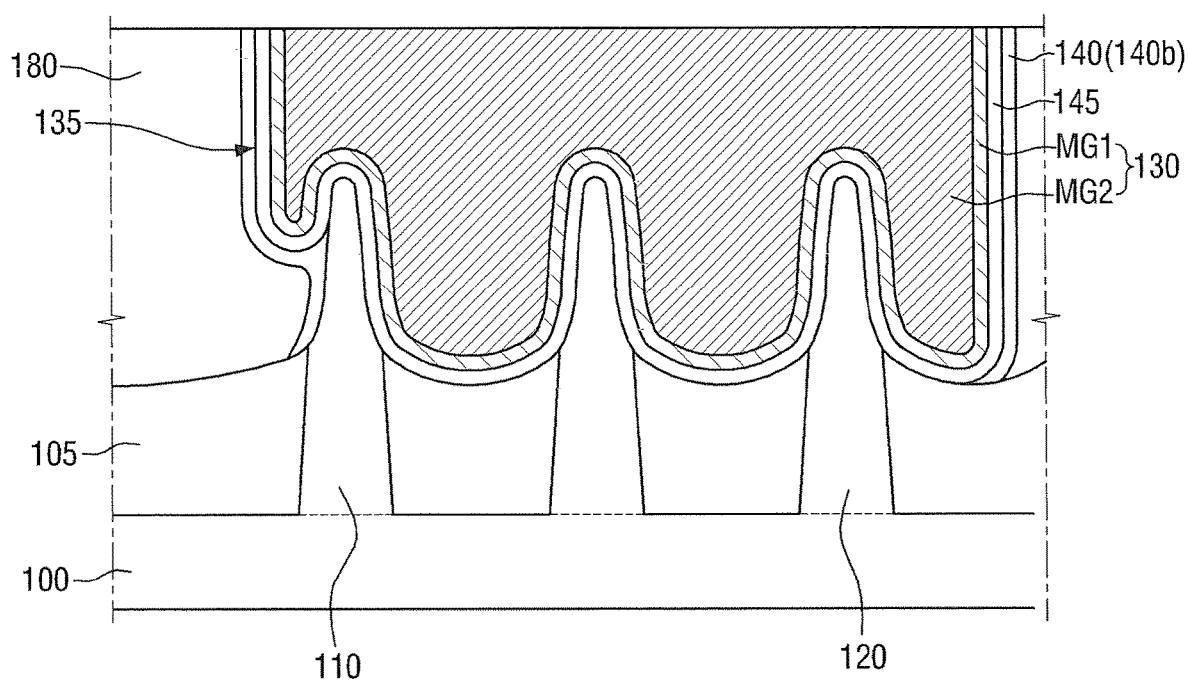
FIGS. 7 and 8 are diagrams for explaining a semiconductor device according to a third embodiment of the present inventive concept.
Figure 8:
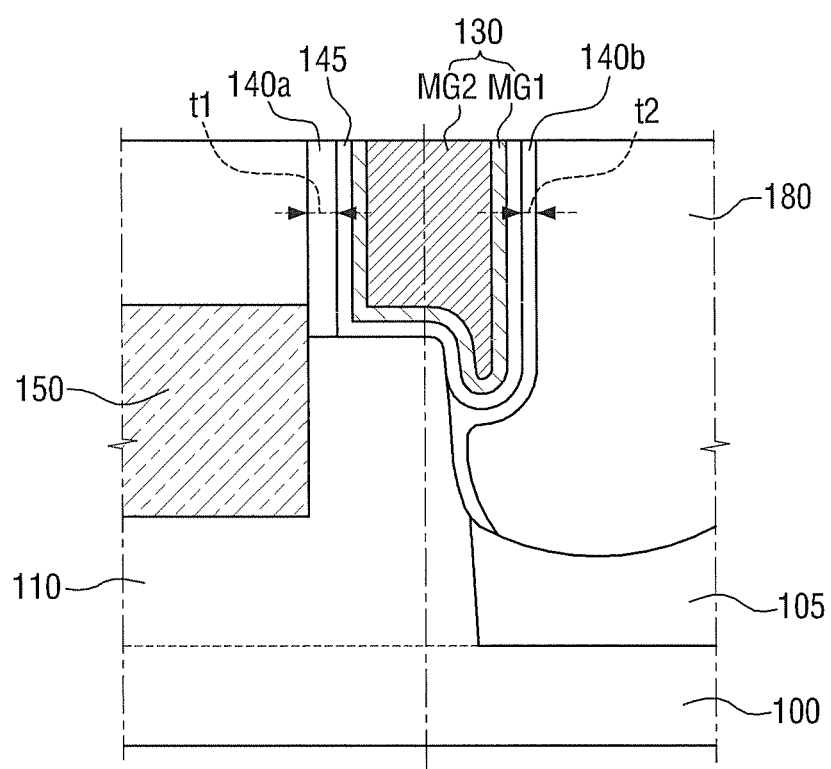

FIGS. 7 and 8 are diagrams for explaining a semiconductor device according to a third embodiment of the present inventive concept. For convenience of explanation, differences from the configurations described with reference to FIGS. 1 to 5 will be mainly described.

For reference, FIG. 7 is a cross-sectional view taken along a line B-B of FIG. 1, and FIG. 8 is a cross-sectional view taken along a line C-C of FIG. 1.

Referring to FIGS. 1, 7 and 8, in a semiconductor device 3 according to a third embodiment of the present inventive concept, a spacer 140 may be formed along the periphery of the first gate electrode 130. A second portion 140b of the spacer formed on the sidewall including the short side of the first gate electrode 130 may be formed.

A first portion 140a of the spacer may be formed on the sidewall of the first gate electrode 130 extending in the second direction Y. The second portion 140b of the spacer may be formed on the sidewall of the first gate electrode 130 extending in the first direction X.

The second portion 140b of the spacer may be formed between the first terminal end 131 of the first gate electrode and the interlayer insulating film 180, and between the second terminal end 132 of the first gate electrode and the interlayer insulating film 180.

A part of the sidewall of the first fin type pattern 110 which overlaps the first gate electrode 130 and protrudes upward from the upper surface of the field insulating film 105 may not be covered with the first gate electrode 130 and the first gate insulating film 145.

Accordingly, this second portion 140b of the spacer may be extended to the upper surface of the field insulating film 105 along the sidewall of the first fin type pattern 110 that is not covered with the first gate electrode 130 and the first gate insulating film 145.

In addition, the sidewall of the first trench 135 may be defined by the spacer 140. More specifically, the sidewall of the first trench 135 facing the long side of the first gate electrode 130 may be defined by the first portion 140a of the spacer. Also, the sidewall including the short side of the first gate electrode 130 may be defined by the second portion 140b of the spacer.

So, the first gate insulating film 145 may be formed along the sidewall of the first portion 140a of the spacer and the sidewall of the second portion 140b of the spacer.

A thickness of the first portion 140a of the spacer may be a first thickness t1, and a thickness of the second portion 140b of the spacer may be a second thickness t2.

In the semiconductor device 3 according to the third embodiment of the present inventive concept, the thickness t1 of the first portion 140a of the spacer and the thickness t2 of the second portion 140b of the spacer may be different from each other. For example, the thickness t1 of the first portion 140a of the spacer may be thicker than the thickness t2 of the second portion 140b of the spacer.

The thickness t1 of the spacer 140 formed on the sidewall including the long side of the first gate electrode 130 may be thicker than the thickness t2 of the spacer 140 formed on the sidewall including the short side of the first gate electrode 130.

The thickness of the spacer 140 formed on the sidewall of the first gate electrode 130 extending in the second direction Y may be thinner than the thickness of the spacer 140 formed on the sidewall of the first gate electrode 130 extending in the first direction X.

That is, the thickness of the spacer 140 at the first terminal end 131 of the first gate electrode and the second terminal end 132 of the first gate electrode may be thinner than the thickness of the spacer 140 in other portions.

Figure 9:
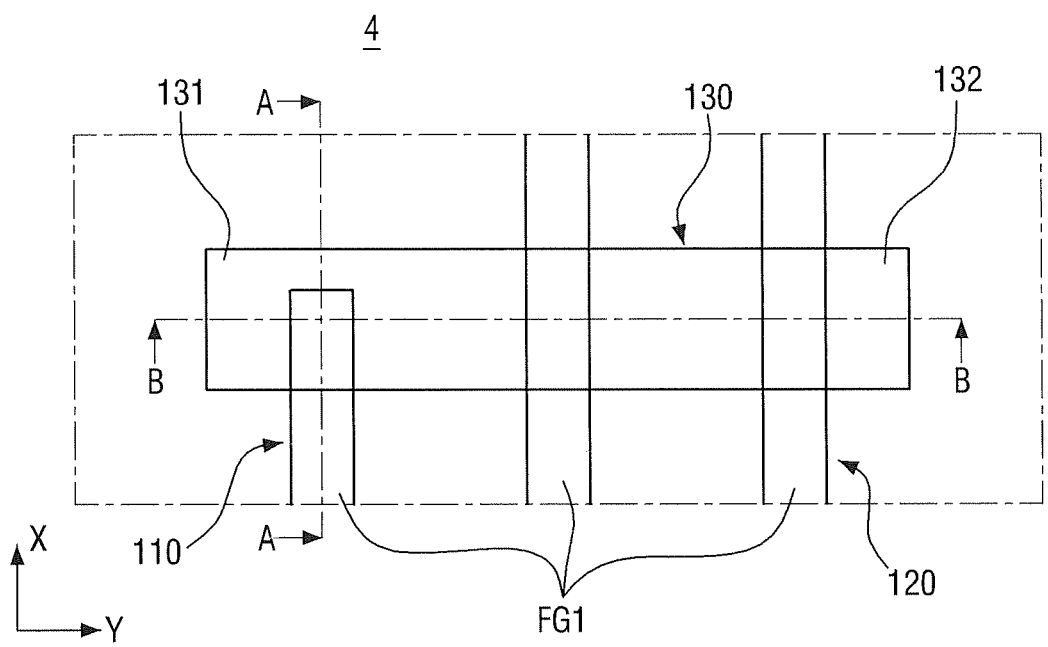
FIG. 9 is a layout diagram for explaining a semiconductor device according to a fourth embodiment of the present inventive concept.
Figure 10:
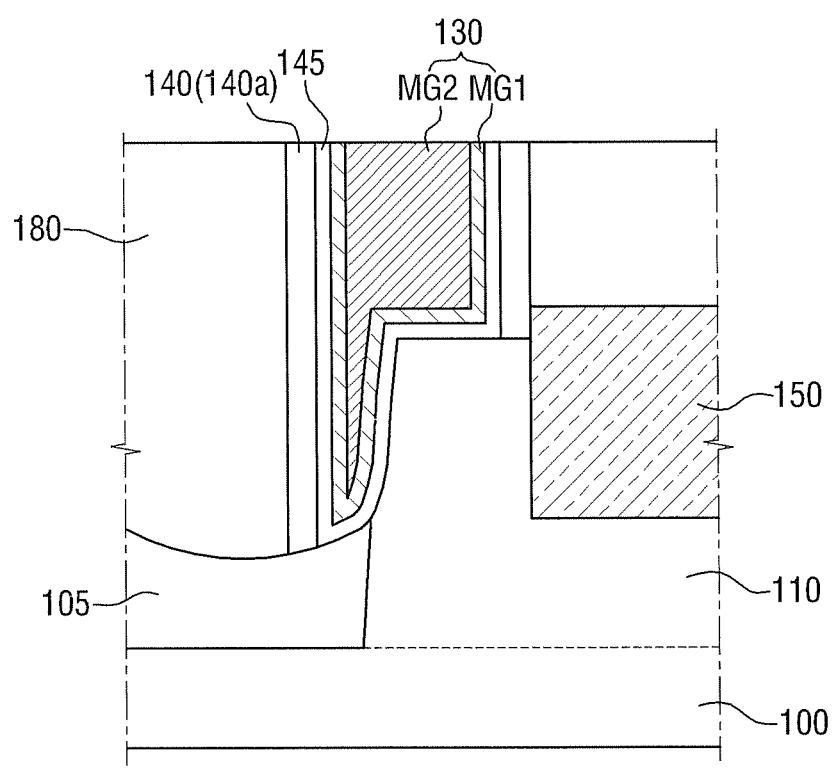
FIG. 10 is a cross-sectional view taken along a line A-A in FIG. 9.

FIG. 9 is a layout diagram for explaining a semiconductor device according to a fourth embodiment of the present inventive concept. FIG. 10 is a cross-sectional view taken along a line A-A of FIG. 9. For convenience of explanation, differences from the configurations described with reference to FIGS. 1 to 5 will be mainly described.

For reference, the cross-sectional view taken along the line B-B of FIG. 9 may be substantially the same as FIG. 3.

Referring to FIGS. 9 and 10, in a semiconductor device 4 according to the fourth embodiment of the present inventive concept, an overlap width of the first fin type pattern 110 and the first gate electrode 130 may be smaller than the width in the first direction X of the first gate electrode 130.

In other words, the first gate electrode 130 may be formed so as to intersect with the terminal end of the first fin type pattern 110.

Although FIG. 9 illustrates that the overlap width of the first fin type pattern group FG1 and the first gate electrode 130 except the first fin type pattern 110 is substantially the same as the width in the first direction X of the first gate electrode 130, it is intended merely for convenience of description and is not limited thereto.

Figure 11:
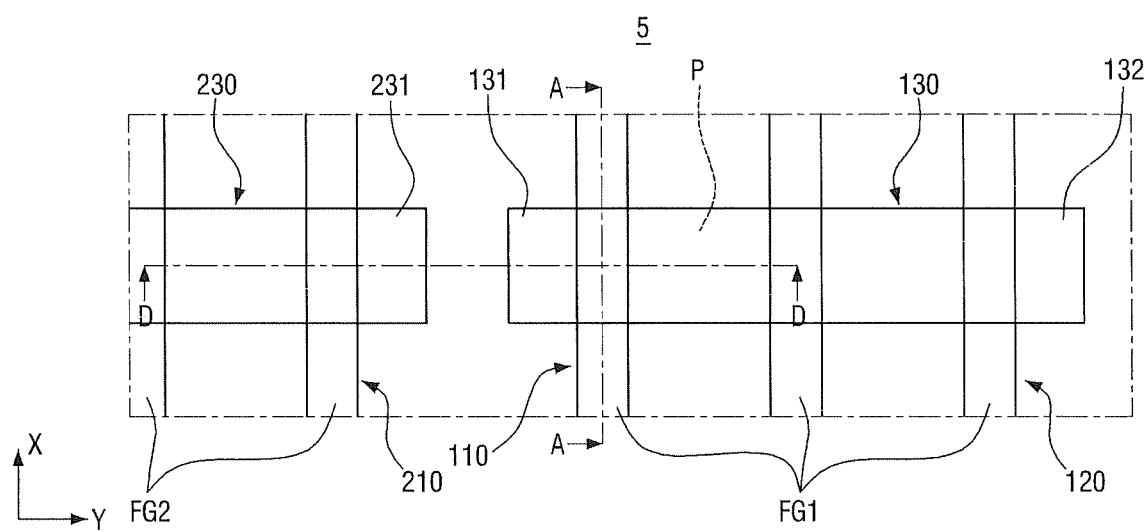
FIG. 11 is a layout diagram for explaining a semiconductor device according to a fifth embodiment of the present inventive concept.
Figure 12:
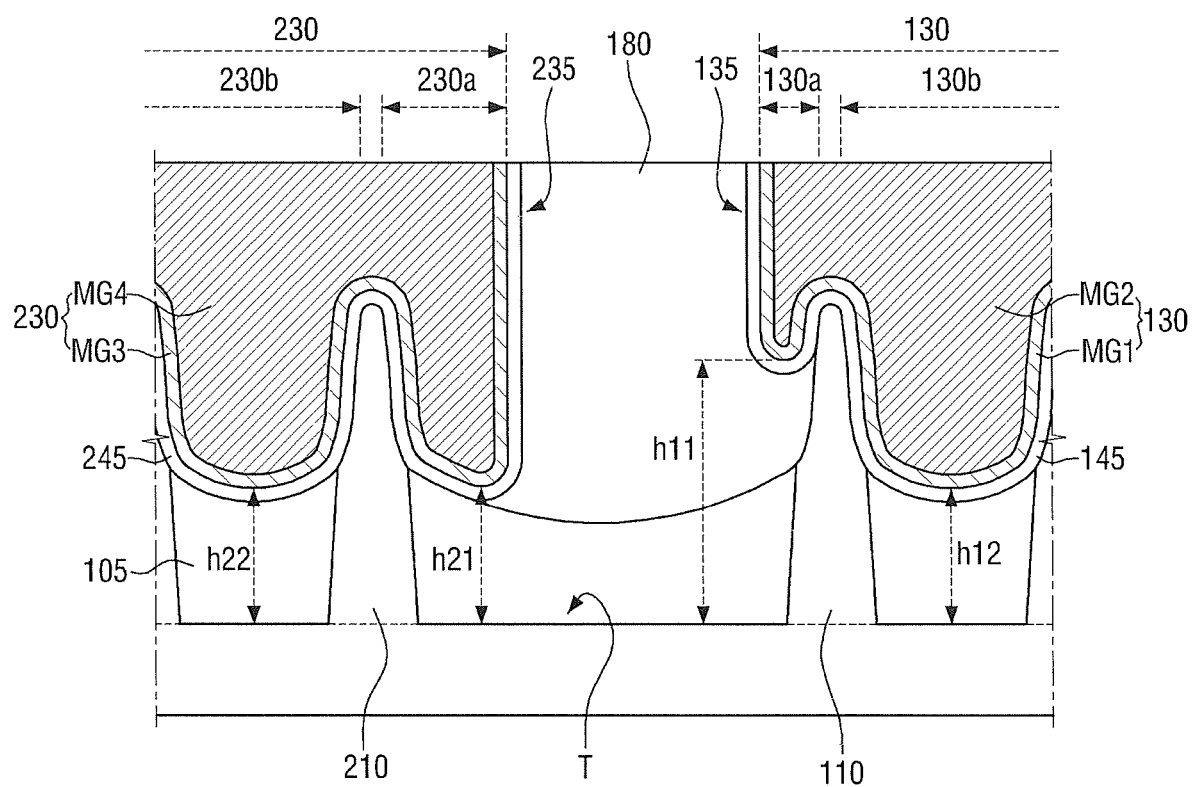
FIG. 12 is a cross-sectional view taken a long a line D-D of FIG. 11.

FIG. 11 is a layout diagram for explaining a semiconductor device according to a fifth embodiment of the present inventive concept. FIG. 12 is a cross-sectional view taken along a line D-D of FIG. 11. For convenience of explanation, differences from the configurations described with reference to FIGS. 1 to 5 will be mainly described.

Referring to FIGS. 11 and 12, a semiconductor device 5 according to the fifth embodiment of the present inventive concept may include a first fin type pattern group FG1, a first gate electrode 130, a second fin type pattern group FG2, a second gate electrode 230 and the like.

The second fin type pattern group FG2 may be formed on the substrate 100. The second fin type pattern group FG2 may protrude from the substrate 100. The second fin type pattern group FG2 may be a group of the fin type patterns that intersect with the second gate electrode 230.

The second fin type pattern group FG2 may be defined by the isolation trench T. The isolation trench T may be disposed on either side of each fin type pattern included in the second fin type pattern group FG2.

In addition, the isolation trench T may be formed between the first fin type pattern group FG1 and the second fin type pattern group FG2, but is not limited thereto. Although the first fin-type pattern group FG1 and the second fin type pattern group FG2 may be separated by a trench deeper than the isolation trench T, it will be described as being separated by the isolation trench T below.

The second fin type pattern group FG2 may include fin type patterns that extend along the first direction X. Each of the fin type patterns included in the second fin type pattern group FG2 may extend along the first direction X. The fin type patterns included in the second fin type pattern group FG2 may be arranged in the second direction Y.

The second fin type pattern group FG2 may include a third fin type pattern 210 that is closest to the first fin type pattern 110. Here, the expression "the first fin type pattern 110 is closest to the third fin type pattern 210" means that the fin type pattern protruding upward from the upper surface of the field insulating film 105 is not disposed between the first fin type pattern 110 and the third fin type pattern 210.

The third fin type pattern 210 may be a fin type pattern which is disposed on the outermost side of the second fin type pattern group FG2. For example, the second fin type pattern group FG2 may not be located on one side of the second fin type pattern 120 in the second direction Y, and the fin type pattern included in the second fin type pattern group FG2 may be located on the other side of the second fin type pattern 120.

At least a part of each fin type pattern included in the second fin type pattern group FG2 may protrude upward from the upper surface of the field insulating film 105. For example, at least a part of the third fin type pattern 210 may protrude upward from the upper surface of the field insulating film 105.

Since other descriptions of the second fin type pattern group FG2 may be substantially similar to those of the first fin type pattern group FG1, it will not be provided below.

The second gate electrode 230 may be formed so as to extend in the second direction Y and intersect with the second fin type pattern group FG2. The second gate electrode 230 may be formed on the field insulating film 105. The second gate electrode 230 may intersect with the third fin type pattern 210.

Similarly to the first gate electrode 130, the second gate electrode 230 may include a long side extending in the second direction Y, and a short side extending in the first direction X.

The second gate electrode 230 may include a terminal end 231 facing the first terminal end 131 of the first gate electrode. The terminal end 231 of the second gate electrode may include the short side of the second gate electrode 230. The terminal end 231 of the second gate electrode may be adjacent to the third fin type pattern 210.

The second gate electrode 230 may include a first portion 230a and a second portion 230b arranged in the second direction Y. The first portion 230a of the second gate electrode may include the terminal end 231 of the second gate electrode.

The first portion 230a of the second gate electrode and the second portion 230b of the second gate electrode may be located with the third fin type pattern 210 interposed between. The first portion 230a of the second gate electrode may be located on one side of the third fin type pattern 210, and the second portion 230b of the second gate electrode may be located on the other side of the third fin type pattern 210.

The second portion 230b of the second gate electrode may be a portion that is closest to the first portion 230a of the second gate electrode. In other words, the second fin type pattern group FG2 except the third fin type pattern 210 may not be disposed between the first portion 230a of the second gate electrode and the second portion 230b of the second gate electrode.

A part of the second gate electrode 230 covering the upper surface of the third fin type pattern 210 may be located between the first portion 230a of the second gate electrode and the second portion 230b of the second gate electrode.

The second gate electrode 230 may include metal layers MG3, MG4. As illustrated, the second gate electrode 230 may be formed by lamination of two or more metal layers MG3, MG4. Since other descriptions of the second gate electrode 230 may be substantially similar to those of the first gate electrode 130, it will not be provided below.

The second gate insulating film 245 may be formed between the second fin-type pattern group FG2 and the second gate electrode 230. The second gate insulating film 245 may be formed between the third fin type pattern 210 and the second gate electrode 230.

The second gate insulating film 245 may be formed along the profile of the second fin type pattern group FG2 protruding upward from the field insulating film 105, and for example, along the profile of the third fin type pattern 210. Further, the second gate insulating film 245 may also be formed between the second gate electrode 230 and the field insulating film 105.

FIG. 12 illustrates that the spacer is not formed on the sidewall including the short side of the gate electrode 230, but it is intended merely for the convenience of explanation and is not limited thereto.

The interlayer insulating film 180 may include a second trench 235 in which the second gate electrode 230 is formed. The second trench 235 may be formed so as to extend long in the second direction Y and intersect with the second fin type pattern group FG2.

A height from the substrate 100 to the lowest part of the first portion 230a of the second gate electrode may be a fifth height h21, and a height from the substrate 100 to the lowest part of the second portion 230b of the second gate electrode may be a sixth height h22.

In the semiconductor device according to the fifth embodiment of the invention, the height h21 from the substrate 100 to the lowest part of the first portion 230a of the second gate electrode may be substantially the same as the height h22 from the substrate 100 to the lowest part of the second portion 230b of the second gate electrode.

In addition, the height h21 from the bottom surface of the isolation trench T to the lowest part of the first portion 230a of the second gate electrode may be substantially the same as the height 22 from the bottom surface of the isolation trench T to the lowest part of the second portion 230b of the second gate electrode.

In other words, each of the first portion 230a of the second gate electrode and the second portion 230b of the second gate electrode may cover the whole sidewalls of the third fin type pattern 21 protruding from the upper surface of the field insulating film 105.

The thickness of the first portion 230a of the second gate electrode located on one side of the third fin type pattern 210 may be substantially the same as the thickness of the second portion 230b of the second gate electrode located on the other side of the third fin type pattern 210. That is, the thickness from the upper surface of the second gate electrode 230 to the lowest part of the first portion 230a of the second gate electrode may be substantially the same as the thickness from the upper surface of the second gate electrode 230 to the lowest part of the second portion 230b of the second gate electrode.

Also, the interlayer insulating film 180 may not be interposed between the lowest part of the first portion 230a of the second gate electrode and the field insulating film 105, and between the lowest part of the second portion 230b of the second gate electrode and the field insulating film 105.

Thus, the second gate insulating film 245 formed between the substrate 100 and the first portion 230a of the second gate electrode and between the substrate 100 and the second portion 230b of the second gate electrode may be in contact with the field insulating film 105.

In the semiconductor device according to the fifth embodiment of the invention, the height h11 from the substrate 100 to the lowest part of the first portion 130a of the first gate electrode may be different from the height h21 from the substrate 100 to the lowest part of the first portion 230a of the second gate electrode. For example, the height h11 from the substrate 100 to the lowest part of the first portion 130a of the first gate electrode may be higher than the height h21 from the substrate 100 to the lowest part of the first portion 230a of the second gate electrode.

The height h11 from the bottom surface of the isolation trench T to the lowest part of the first portion 130a of the first gate electrode may be higher than the height h21 from the bottom surface of the isolation trench T to the lowest part of the first portion 230a of the second gate electrode.

In other words, the thickness of the first portion 130a of the first gate electrode may be different from the thickness of the first portion 230a of the second gate electrode.

More specifically, the thickness from the upper surface of the second gate electrode 230 to the lowest part of the first portion 230a of the second gate electrode may be thicker than the thickness from the upper surface of the first gate electrode 130 to the lowest part of the first portion 130a of the first gate electrode.

Figure 13:
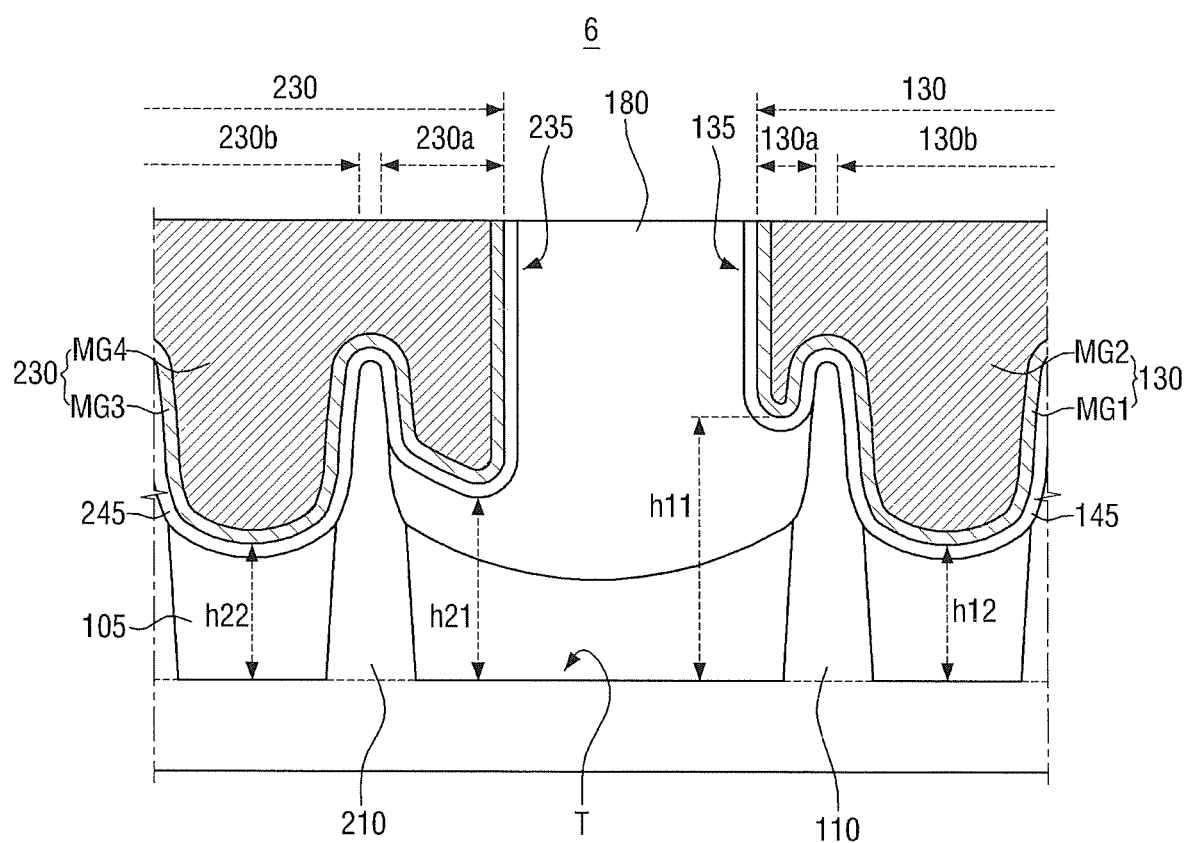
FIG. 13 is a diagram for explaining a semiconductor device according to a sixth embodiment of the present inventive concept.

FIG. 13 is a diagram for explaining a semiconductor device according to a sixth embodiment of the present inventive concept. For convenience of explanation, differences from the configurations described with reference to FIGS. 11 and 12 will be mainly described.

Referring to FIG. 13, in a semiconductor device 6 according to the sixth embodiment of the present inventive concept, a height h21 from the substrate 100 to the lowest part of the first portion 230a of the second gate electrode may be higher than a height h22 from the substrate 100 to the lowest part of the second portion 230b of the second gate electrode.

The height h21 from the bottom surface of the isolation trench T to the lowest part of the first portion 230a of the second gate electrode may be higher than the height h22 from the bottom surface of the isolation trench T to the lowest part of the second portion 230b of the second gate electrode.

Further, the thickness of the first portion 230a of the second gate electrode located on one side of the third fin type pattern 210 may be thinner than the thickness of the second portion 230b of the second gate electrode located on the other side of the third fin type pattern 210.

The bottom surface of a part of the second trench 235 in which the second portion 230b of the second gate electrode is formed is defined by the field insulating film 105, but the bottom surface of the other part of the second trench 235 in which the first portion 230a of the second gate electrode is formed may be defined by the interlayer insulating film 180.

Thus, a part of the interlayer insulating film 180 may be interposed between the lowest part of the first portion 230a of the second gate electrode and the field insulating film 105. However, the interlayer insulating film 180 may not be interposed between the lowest part of the second portion 230b of the second gate electrode and the field insulating film 105.

In addition, the second gate insulating film 245 formed between the substrate 100 and the first portion 230a of the second gate electrode may not be in contact with the field insulating film 105. Meanwhile, the second gate insulating film 245 formed between the substrate 100 and the second portion 230b of the second gate electrode may be in contact with the field insulating film 105.

In the semiconductor device according to the sixth embodiment of the invention, the height h11 from the substrate 100 to the lowest part of the first portion 130a of the first gate electrode may be different from the height h21 from the substrate 100 to the lowest part of the first portion 230a of the second gate electrode.

Figure 14:
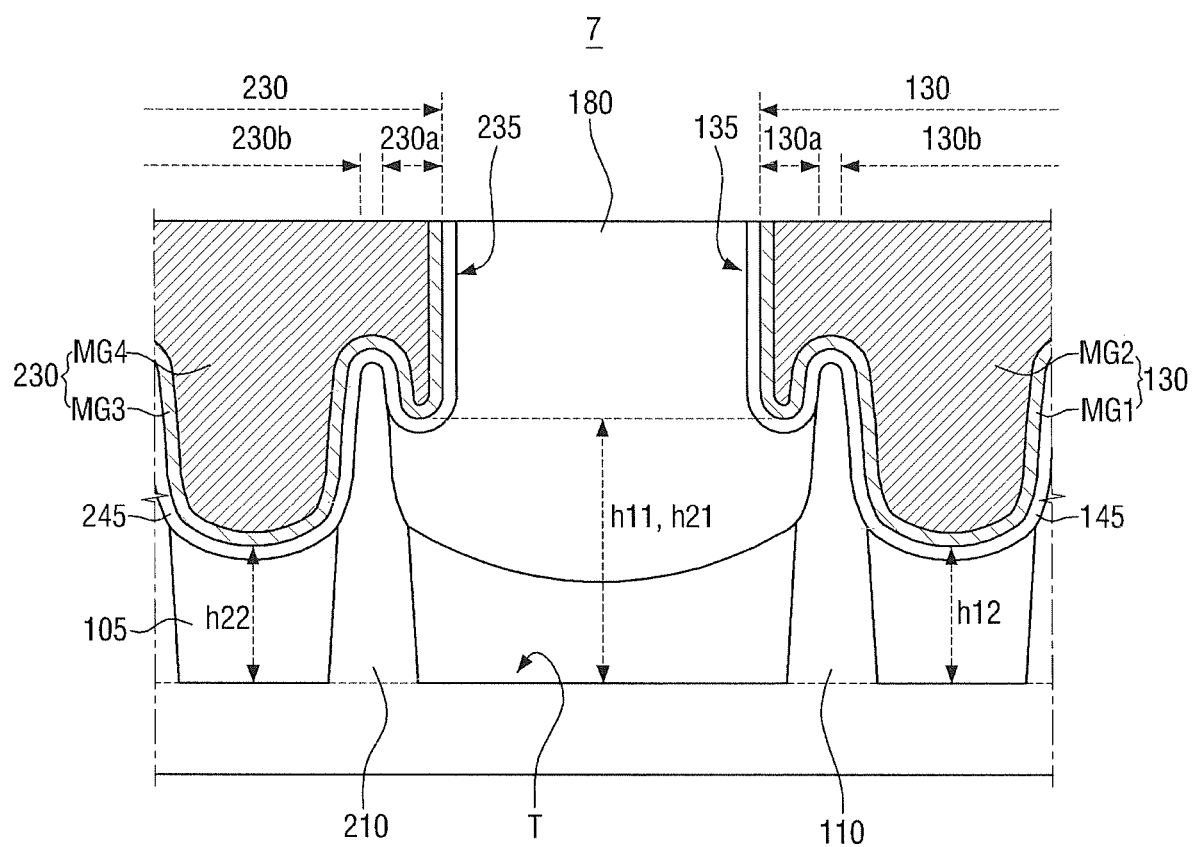
FIG. 14 is a diagram for explaining a semiconductor device according to a seventh embodiment of the present inventive concept.

FIG. 14 is a diagram for explaining a semiconductor device according to a seventh embodiment of the present inventive concept. For convenience of explanation, differences from the configurations described with reference to FIG. 13 will be mainly described.

Referring to FIG. 14, in a semiconductor device 7 according to the seventh embodiment of the present inventive concept, a height h11 from the substrate 100 to the lowest part of the first portion 130a of the first gate electrode may be substantially the same as a height h21 from the substrate 100 to the lowest part of the first portion 230a of the second gate electrode.

The height h21 from the bottom surface of the isolation trench T to the lowest part of the first portion 230a of the second gate electrode may be substantially the same as the height h11 from the bottom surface of the isolation trench T to the lowest part of the first portion 130a of the first gate electrode.

Figure 15:
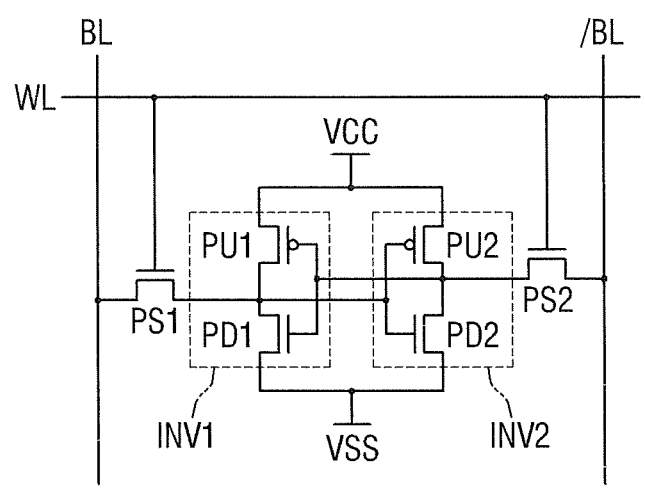
FIG. 15 is a circuit diagram for explaining a semiconductor device according to an eighth embodiment of the present inventive concept.
Figure 16:
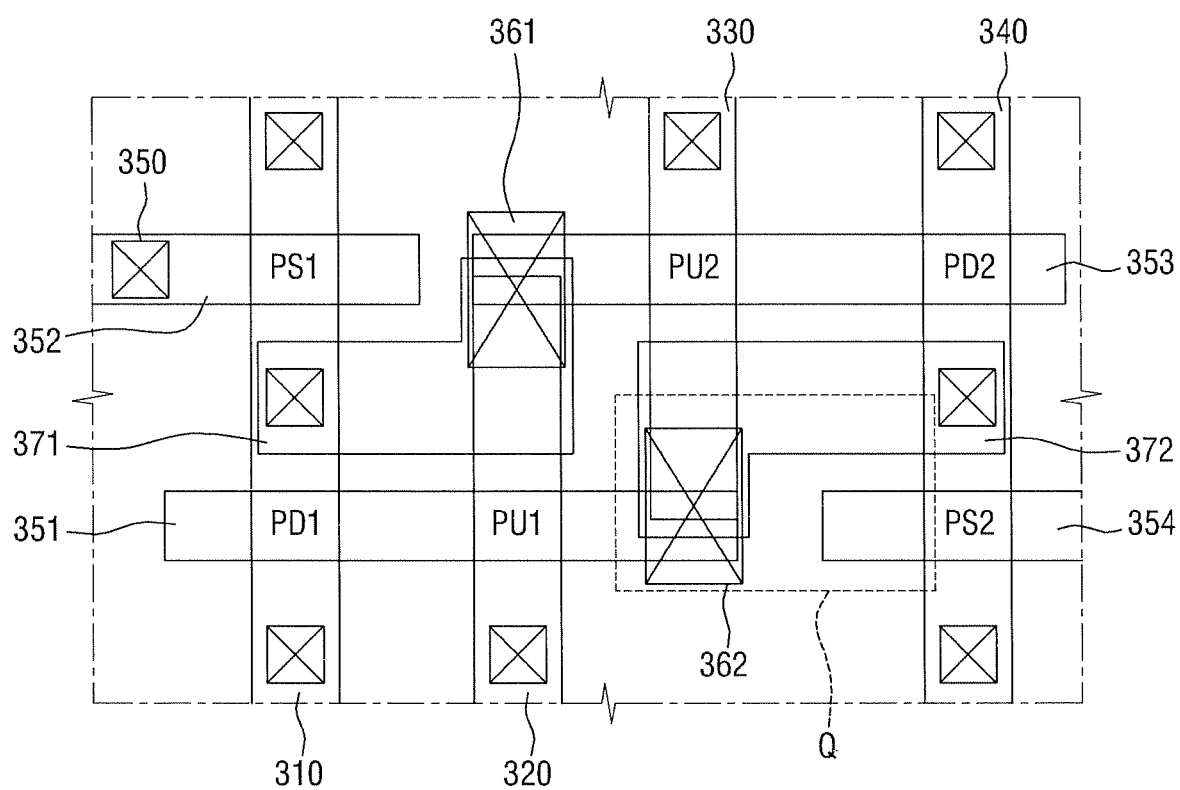
FIG. 16 is a layout diagram of the semiconductor device of FIG. 15.

FIG. 15 is a circuit diagram for explaining a semiconductor device according to an eighth embodiment of the present inventive concept. FIG. 16 is a layout diagram of the semiconductor device of FIG. 15.

Referring to FIG. 15, the semiconductor device may include a pair of inverters INV1, INV2 connected in parallel between a power supply node Vcc and a ground node Vss, and a first pass transistor PS1 and a second pass transistor PS2 connected to an output node of each of the inverters INV1, INV2. Each of the first pass transistor PS1 and the second pass transistor PS2 may be connected to a bit line BL and a complementary bit line/BL. The gates of the first pass transistor PS1 and the second pass transistor PS2 may be connected to a word line WL.

The first inverter INV1 includes a first pull-up transistor PU1 and a first pull-down transistor PD1 which are connected to each other in series, and the second inverter INV2 includes a second pull-up transistor and PU2 and a second pull-down transistor PD2 which are connected to each other in series. The first pull-up transistor PU1 and the second pull-up transistor PU2 may be a PFET transistor, and the first pull-down transistor PD1 and the second pull-down transistor PD2 may be an NFET transistor.

Further, in order for the first inverter INV1 and the second inverter INV2 to constitute a latch circuit, the input node of the first inverter INV1 is connected to the output node of the second inverter INV2, and the input node of the second inverter INV2 is connected to the output node of the first inverter INV1.

Here, referring to FIGS. 15 and 16, a first active fin 310, a second active fin 320, a third active fin 330 and a fourth active fin 340 spaced apart from each other are formed so as to extend long in one direction (e.g., a vertical direction of FIG. 16). The extension length of the second active fin 320 and the third active fin 330 may be shorter than that of the first active fin 310 and the fourth active fin 340.

Further, a first gate line 351, a second gate line 352, a third gate line 353 and a fourth gate line 354 extend long in the other direction (e.g., in a horizontal direction of FIG. 16) and are formed so as to intersect with the first active fin 310 to the fourth active fin 340.

Specifically, the first gate line 351 may completely intersect with the first active fin 310 and the second active fin 320 and may partially overlap the terminal end of the third active fin 330. The third gate line 353 may completely intersect with the fourth active fin 340 and the third active fin 330 and may partially overlap the terminal end of the second active fin 320. Each of the second gate line 352 and the fourth gate line 354 is formed so as to intersect with the first active fin 310 and the fourth active fin 340.

As illustrated, the first pull-up transistor PU1 is defined around a region in which the first gate line 351 intersects with the second active fin 320, the first pull-down transistor PD1 is defined around a region in which the first gate line 351 intersects with the first active fin 310, and the first pass transistor PS1 is defined around a region in which the second gate line 352 intersects with the first active fin 310.

The second pull-up transistor PU2 is defined around a region in which the third gate line 353 intersects with the third active fin 330, the second pull-down transistor PD2 is defined around a region in which the third gate line 353 intersects with the fourth active fin 340, and the second pass transistor PS2 is defined around a region in which the fourth gate line 354 intersects with the fourth active fin 340.

Although it is not clearly illustrated, on both sides of the region in which the first to fourth gate lines 351 to 354 intersect with the first to fourth active fins 310, 320, 330, 340, the source/drain may be formed, and a large number of contacts 350 may be formed.

Furthermore, a first shared contact 361 connects the second active fin 320, the third gate line 353 and the wiring 371 at the same time. A second shared contact 362 connects the third active fin 330, the first gate line 351 and the wiring 372 at the same time.

At least one of the semiconductor devices according to the above-described embodiments of the present inventive concept may be adopted to such a SRAM layout, and for example, may be adopted to a portion Q or the like of FIG. 16.

Figure 17:
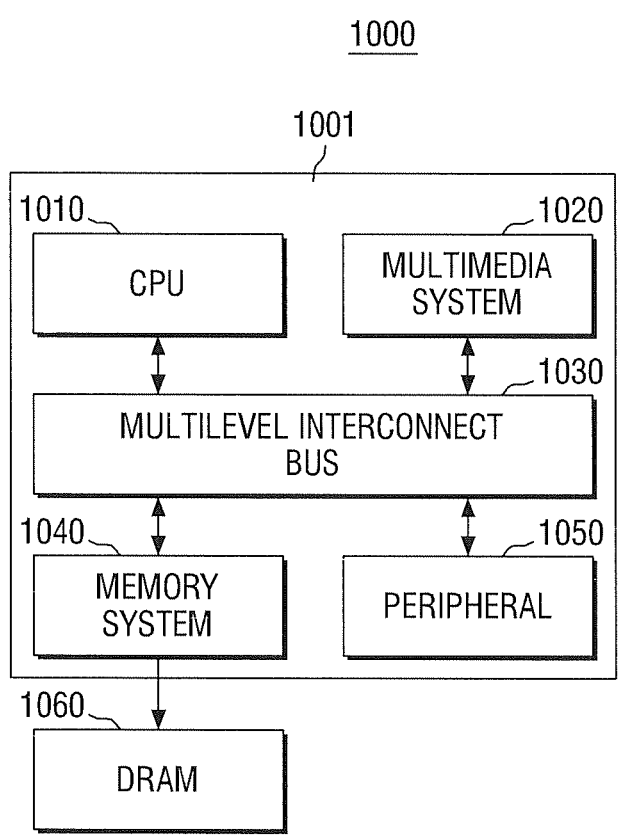
FIG. 17 is a block diagram of a SoC system including the semiconductor device according to the embodiments of the present inventive concept.

FIG. 17 is a block diagram of a SoC system including the semiconductor device according to the embodiments of the present inventive concept.

Referring to FIG. 17, the SoC system 1000 includes an application processor 1001 and a DRAM 1060.

The application processor 1001 may include a central processing unit 1010, a multimedia system 1020, a bus 1030, a memory system 1040 and a peripheral circuit 1050.

The central processing unit 1010 may perform the operations necessary for driving of the SoC system 1000. In some embodiments of the present inventive concept, the central processing unit 1010 may be configured in a multi-core environment which includes a plurality of cores.

The multimedia system 1020 may be used to perform a variety of multimedia functions in the SoC system 1000. The multi-media system 1020 may include a 3D engine module, a video codec, a display system, a camera system, a post-processor and the like.

The bus 1030 may be used to perform the data communication among the central processing unit 1010, the multimedia system 1020, the memory system 1040 and the peripheral circuits 1050 each other. In some embodiments of the present inventive concept, the bus 1030 may have a multilayer structure. Specifically, as examples of the bus 1030, a multi-layer AHB (multi-layer Advanced High-performance Bus) or a multi-AXI (multi-layer Advanced eXtensible Interface) may be used, but the invention is not limited thereto.

The memory system 1040 may provide the necessary environment in which the application processor 1001 is connected to an external memory (e.g., a DRAM 1060) to perform the high-speed operation. In some embodiments of the present inventive concept, the memory system 1040 may include another controller (e.g., a DRAM controller) for controlling the external memory (e.g., the DRAM 1060).

The peripheral circuits 1050 may provide a necessary environment in which the SoC system 1000 is connected to an external device (e.g., a main board). Thus, the peripheral circuit 1050 may be provided with various interfaces which allow the external device connected to the SoC system 1000 to be compatible.

The DRAM 1060 may function as an operating memory required for operation of the application processor 1001. In some embodiments of the present inventive concept, as illustrated, the DRAM 1060 may be located outside the application processor 1001. Specifically, the DRAM 1060 may be packaged with the application processor 1001 in the form of PoP (Package on Package).

At least one of the components of the SoC system 1000 may include at least one of the semiconductor devices according to the above-described embodiments of the present inventive concept.

Figure 18:
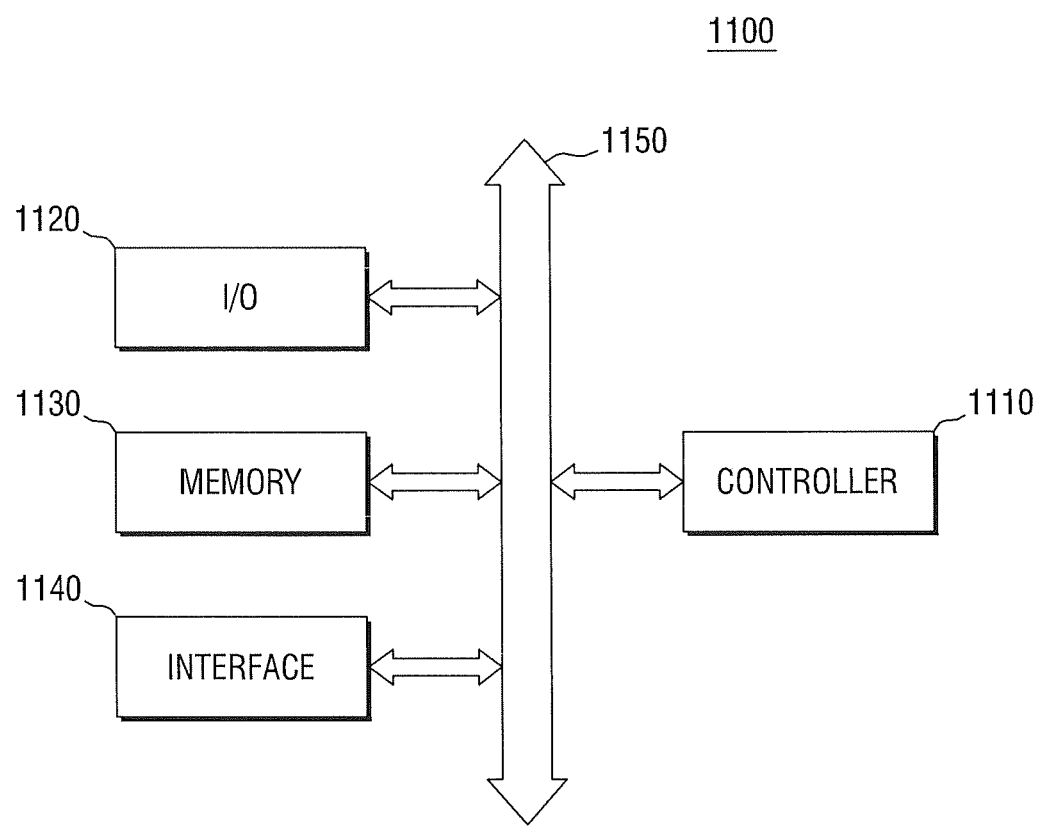
FIG. 18 is a block diagram of an electronic system including the semiconductor device according to the embodiments of the present inventive concept.

FIG. 18 is a block diagram of an electronic system including the semiconductor device according to the embodiments of the present inventive concept.

Referring to FIG. 18, an electronic system 1100 according to an embodiment of the present inventive concept may include a controller 1110, an input-output device (I/O) 1120, a memory device 1130, an interface 1140 and a bus 1150. The controller 1110, the input/output device 1120, the memory device 1130 and/or the interface 1140 may be coupled together via the bus 1150. The bus 1150 corresponds to a path in which the data are moved.

The controller 1110 may include at least one of a microprocessor, a digital signal process, a microcontroller, and logic elements capable of performing the function similar to these elements. The input/output device 1120 may include a keypad, a keyboard, a display device and the like. The memory device 1130 may store data and/or instruction words. The interface 1140 may perform the functions of transferring the data to the communication network or receiving the data from the communication network. The interface 1140 may be in a wired or wireless form. For example, the interface 1140 may include an antenna or a wired and wireless transceiver.

Although it is not illustrated, the electronic system 1100 may further include a high-speed DRAM and/or SDRAM as an operation memory for improving the operation of the controller 1110.

The semiconductor devices according to the above-mentioned embodiments of the present inventive concept may be provided inside the memory device 1130 or may be provided as a part of the controller 1110, the input/output device (I/O) 1120 or the like.

The electronic system 1100 may be applied to a personal digital assistant (PDA), a portable computer, a web tablet, a wireless phone, a mobile phone, a digital music player, a memory card or all electronic products that may transmit and/or receive information in a wireless environment.

Figure 19:
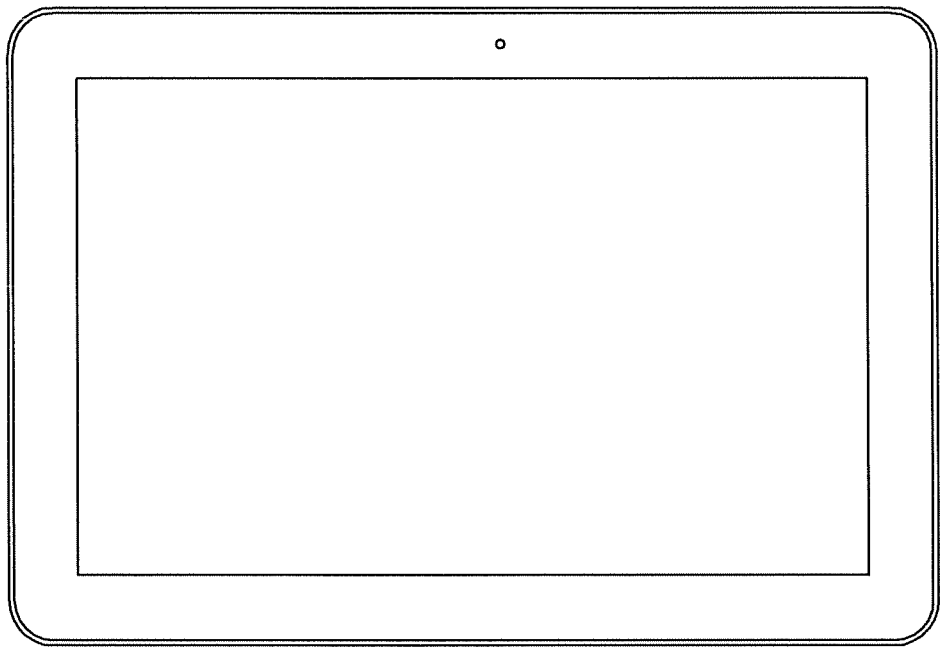
FIGS. 19 to 21 are exemplary semiconductor systems to which the semiconductor device according to the embodiments of the present inventive concept can be applied.
Figure 20:
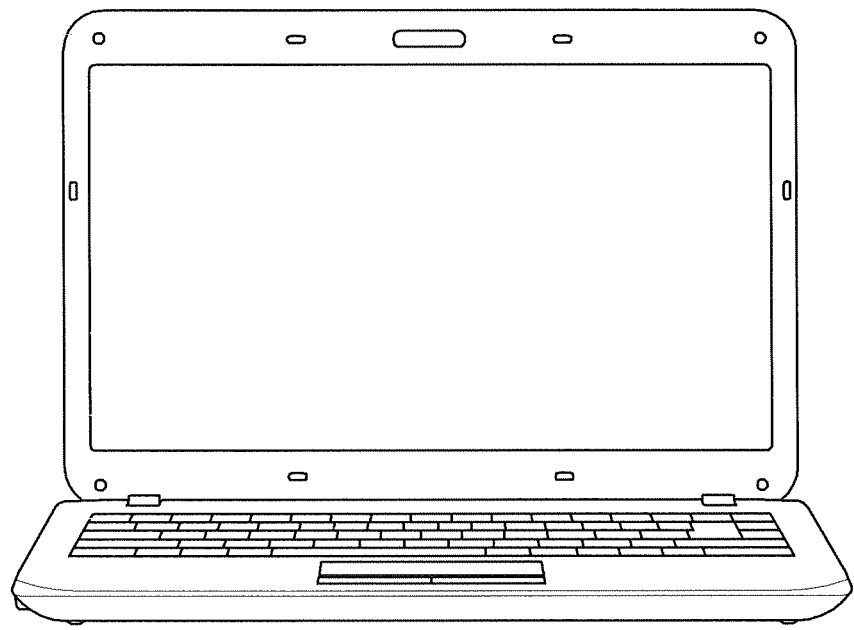
Figure 21:
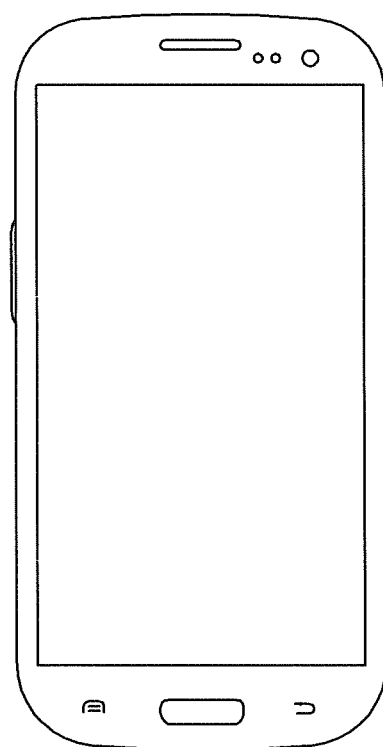

FIGS. 19 to 21 are exemplary semiconductor systems to which the semiconductor devices according to some embodiments of the present inventive concept may be applied.

FIG. 19 is a diagram illustrating a tablet PC 1200, FIG. 20 is a diagram illustrating a laptop computer 1300, and FIG. 21 is a diagram illustrating a smart phone 1400. The semiconductor devices according to the embodiments of the present inventive concept may be used in the tablet PC 1200, the laptop computer 1300, the smart phone 1400 or the like.

Further, it will be apparent to those skilled in the art that the semiconductor devices according to some embodiments of the present inventive concept may also be applied to other integrated circuit devices that are not illustrated.

That is, although only the tablet PC 1200, the laptop computer 1300 and the smart phone 1400 are adopted as an example of the semiconductor system according to this embodiment above, the example of the semiconductor system according to this embodiment is not limited thereto.

In some embodiments of the present inventive concept, the semiconductor system may be achieved by a computer, a ultra mobile PC (UMPC), a workstation, a net-book, personal digital assistants (PDA), a portable computer, a wireless phone, a mobile phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player or the like.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device comprising:
   a field insulating film on a substrate;
   a first fin type pattern which protrudes upward from an upper surface of the field insulating film on the substrate and extends a first direction;
   a gate electrode which includes a first sidewall and a second sidewall opposing each other in the first direction and extends a second direction different from the first direction,
   wherein the gate electrode includes a first portion and a second portion, the first portion being located on one side of the first fin type pattern and including a first terminal end of the gate electrode, and the second portion being located on the other side of the first fin type pattern; and
   an interlayer insulating film on the field insulating film,
   wherein a portion of the interlayer insulating film is interposed between the first portion of the gate electrode and an upper surface of the field insulating film,
   wherein the first fin type pattern includes a third sidewall disposed between the first sidewall of the gate electrode and the second sidewall of the gate electrode,
   wherein the third sidewall of the first fin type pattern extends in the second direction and connects the one side of the first fin type pattern and the other side of the first fin type pattern,
   wherein a distance, measured in the first direction, between the first sidewall and the third sidewall is different from a distance, measured in the first direction, between the second sidewall and the third sidewall, and
   wherein a distance from an upper surface of the gate electrode to a lowest part of the first portion of the gate electrode is different from a distance from the upper surface of the gate electrode to a lowest part of the second portion of the gate electrode.

2. The semiconductor device of claim 1,
   wherein the second sidewall of the gate electrode intersects with the first fin type pattern, and
   wherein the distance between the second sidewall of the gate electrode and the third sidewall of the first fin type pattern is greater than the distance between the first sidewall of the gate electrode and the third sidewall of the first fin type pattern.

3. The semiconductor device of claim 1, further comprising:
   a gate insulating film formed along a profile of the first fin type pattern between the gate electrode and the substrate,
   wherein a part of the third sidewall is contact with the field insulating film.

4. The semiconductor device of claim 3, wherein a lower part of the third sidewall is contact with the field insulating film, and an upper part of the third sidewall is contact with the gate insulating film.

5. The semiconductor device of claim 1,
   wherein the distance from the upper surface of the gate electrode to a lowest part of the first portion of the gate electrode is less than the distance from the upper surface of the gate electrode to a lowest part of the second portion of the gate electrode.

6. The semiconductor device of claim 1, further comprising:
   a gate insulating film formed along a profile of the first fin type pattern between the gate electrode and the substrate,
   wherein the gate insulating film between the second portion and the substrate is in contact with the field insulating film, and
   wherein portions of the gate insulating film between the first portion and the substrate are not in contact with the field insulating film.

7. The semiconductor device of claim 6, further comprising:
   an interlayer insulating film on the field insulating film,
   wherein the gate insulating film is formed between the interlayer insulating film and the gate electrode, and
   wherein the gate insulating film is in contact with the interlayer insulating film in the first terminal end.

8. The semiconductor device of claim 1, further comprising a trench which defines the first fin type pattern, wherein a height from a bottom surface of the trench to the lowest part of the first portion is higher than a height from the bottom surface of the trench to the lowest part of the second portion.

9. The semiconductor device of claim 1, further comprising:
a second fin type pattern which intersects with the gate electrode,
wherein the gate electrode includes a fifth portion, a sixth portion, and a second terminal end corresponding to the first terminal end,
wherein the fifth portion is disposed between the first fin type pattern and the second fin type pattern, and
wherein the sixth portion includes the second terminal end of the gate electrode.

10. The semiconductor device of claim 9,
wherein a distance from the upper surface of the gate electrode to a lowest part of the fifth portion of the gate electrode is substantially the same as a distance from the upper surface of the gate electrode to a lowest part of the sixth portion of the gate electrode.

11. The semiconductor device of claim 1, further comprising:
an interlayer insulating film on the field insulating film; and
a spacer formed between the interlayer insulating film and the first terminal end of the gate electrode.

12. A semiconductor device comprising:
a fin type pattern which includes a lower part and an upper part on a substrate, the fin type pattern including a first sidewall, a second sidewall and a third sidewall, the first sidewall and the second sidewall opposing each other, and the third sidewall connected to the first sidewall and the second sidewall;
a field insulating film which is in contact with the lower part of the fin type pattern on the substrate and is not in contact with the upper part of the fin type pattern; and
a gate electrode which intersects with the fin type pattern, and includes a first portion, a second portion and a third portion, the first portion being located on the first sidewall of the fin type pattern, the second portion being located on the second sidewall of the fin type pattern, and the third portion being located on the third sidewall of the fin type pattern,
wherein the first portion covers the whole first sidewall of the upper part of the fin type pattern which overlaps the gate electrode,
the second portion covers a part of the second sidewall of the upper part of the fin type pattern which overlaps the gate electrode, and
the third portion covers the whole third sidewall of the upper part of the fin type pattern which overlaps the gate electrode.

13. The semiconductor device of claim 12,
wherein a distance from the third sidewall to the gate electrode overlapping the fin type pattern is different a distance from the third sidewall to the gate electrode not overlapping the fin type pattern.

14. The semiconductor device of claim 13,
wherein the distance from the third sidewall to the gate electrode overlapping the fin type pattern is greater than the distance from the third sidewall to the gate electrode not overlapping the fin type pattern.

15. The semiconductor device of claim 12,
wherein the second portion includes a terminal end of the gate electrode.

16. The semiconductor device of claim 12, further comprising:
an interlayer insulating film on the field insulating film,
wherein a part of the interlayer insulating film is interposed between the second portion and the field insulating film, and
wherein the interlayer insulating film is not interposed between the first portion and the field insulating film, and the third portion and the field insulating film.

17. The semiconductor device of claim 12, further comprising:
a gate insulating film formed along a profile of the fin type pattern between the fin type pattern and the gate electrode,
wherein the gate insulating film extends along the whole first sidewall of the upper part of the fin type pattern, extends along a part of the second sidewall of the upper part of the fin type pattern, and extends along the whole third sidewall of the upper part of the fin type pattern.

18. A semiconductor device comprising:
a field insulating film on a substrate;
a first fin type pattern which is formed on the substrate and protrudes upward from an upper surface of the field insulating film; and
a gate electrode which intersects with the first fin type pattern on the field insulating film and includes a first portion, a second portion, a third portion and a fourth portion,
the first portion being located on one side of the first fin type pattern and including a first terminal end of the gate electrode,
the second portion being located on the other side of the first fin type pattern,
the third portion being located on an upper surface of the first fin type pattern, and
the fourth portion being located on an upper surface of the field insulating film between the first portion to the third portion,
wherein a distance from an upper surface of the gate electrode to a lowest part of the first portion of the gate electrode is different from a distance from the upper surface of the gate electrode to a lowest part of the first second portion of the gate electrode, and
wherein a distance from the upper surface of the gate electrode to a lowest part of the third portion of the gate electrode is different from a distance from the upper surface of the gate electrode to a lowest part of the fourth portion of the gate electrode.

19. The semiconductor device of claim 18,
wherein the distance from the upper surface of the gate electrode to the lowest part of the first portion of the gate electrode is less than the distance from the upper surface of the gate electrode to the lowest part of the second portion of the gate electrode, and
wherein the distance from the upper surface of the gate electrode to the lowest part of the third portion of the gate electrode is less than the distance from the upper surface of the gate electrode to the lowest part of the fourth portion of the gate electrode.

20. The semiconductor device of claim 18, further comprising:
an interlayer insulating film on the field insulating film,
wherein a part of the interlayer insulating film is interposed between the first portion and the field insulating film, and
wherein the interlayer insulating film is not interposed between the second portion and the field insulating film, between the third portion and the field insulating film, and between the fourth portion and the field insulating film.

* * * * *